United States Patent
Sakano

(10) Patent No.: US 9,136,420 B2
(45) Date of Patent: Sep. 15, 2015

(54) SOLID-STATE IMAGING DEVICE WITH PHOTOELECTRIC CONVERSION SECTION, METHOD OF MANUFACTURING THE SAME, AND ELECTRONIC DEVICE WITH PHOTOELECTRIC CONVERSION SECTION

(75) Inventor: Yorito Sakano, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 92 days.

(21) Appl. No.: 13/242,483

(22) Filed: Sep. 23, 2011

(65) Prior Publication Data

US 2012/0080726 A1    Apr. 5, 2012

(30) Foreign Application Priority Data

Oct. 4, 2010   (JP) ................................. 2010-225088

(51) Int. Cl.
*H01L 27/148* (2006.01)
*H01L 31/108* (2006.01)
*H01L 27/146* (2006.01)

(52) U.S. Cl.
CPC .......... *H01L 31/108* (2013.01); *H01L 27/1461* (2013.01); *H01L 27/1464* (2013.01); *H01L 31/1085* (2013.01); *H01L 27/1465* (2013.01); *H01L 27/14649* (2013.01)

(58) Field of Classification Search
CPC ....................... H01L 27/1465; H01L 27/14649
USPC ................................. 257/E31.07, 225; 438/57
See application file for complete search history.

(56) References Cited

U.S. PATENT DOCUMENTS

| | | | | |
|---|---|---|---|---|
| 6,002,142 | A * | 12/1999 | Paoli ............................... | 257/21 |
| 7,755,090 | B2 * | 7/2010 | Abe et al. ........................ | 257/69 |
| 7,800,148 | B2 * | 9/2010 | Lee et al. ...................... | 257/292 |
| 2003/0025160 | A1 | 2/2003 | Suzuki et al. | |
| 2008/0296629 | A1 | 12/2008 | Mabuchi | |
| 2009/0200589 | A1 * | 8/2009 | Qian et al. .................... | 257/292 |
| 2010/0230594 | A1 * | 9/2010 | Honda et al. .................. | 250/332 |

FOREIGN PATENT DOCUMENTS

| | | |
|---|---|---|
| JP | 01-187858 | 7/1989 |
| JP | 10-079499 | 3/1998 |
| JP | 2005-347708 | 12/2005 |

(Continued)

OTHER PUBLICATIONS

Japanese Office Action issued in connection with related Japanese patent application No. JP 2010-0225088 dated Jul. 8, 2014.

(Continued)

*Primary Examiner* — Caleb Henry
*Assistant Examiner* — Alexander Belousov
(74) *Attorney, Agent, or Firm* — Dentons US LLP

(57) ABSTRACT

Disclosed herein is a solid-state imaging device including: a semiconductor layer including a photoelectric conversion section receiving incident light and generating a signal charge; and a light absorbing section for absorbing transmitted light transmitted by the photoelectric conversion section and having a longer wavelength than light absorbed by the photoelectric conversion section, the transmitted light being included in the incident light, the light absorbing section being disposed on a side of another surface of the semiconductor layer on an opposite side from one surface of the semiconductor layer, the incident light being made incident on the one surface of the semiconductor layer.

22 Claims, 21 Drawing Sheets

(56) References Cited

FOREIGN PATENT DOCUMENTS

| | | |
|---|---|---|
| JP | 3759435 | 1/2006 |
| JP | 2006-120805 | 5/2006 |
| JP | 2008-103668 | 5/2008 |
| JP | 2009-071308 | 4/2009 |
| JP | 2012-018951 | 1/2012 |

OTHER PUBLICATIONS

Japanese Office Examination Report issued in connection with related Japanese Patent Application No. JP 2010-225088 dated Mar. 17, 2015.

Chinese Office Examination Report issued in connection with related Chinese Patent Application No. CN 201110301665.2 dated Apr. 3, 2015.

* cited by examiner

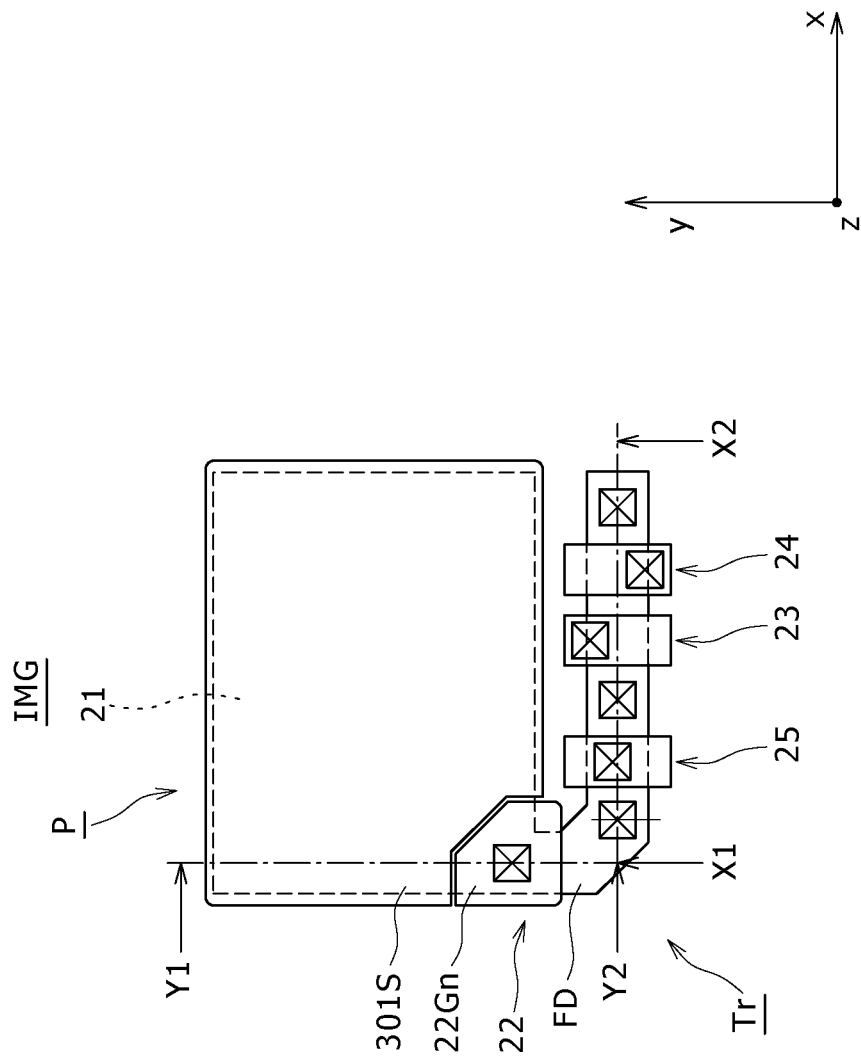

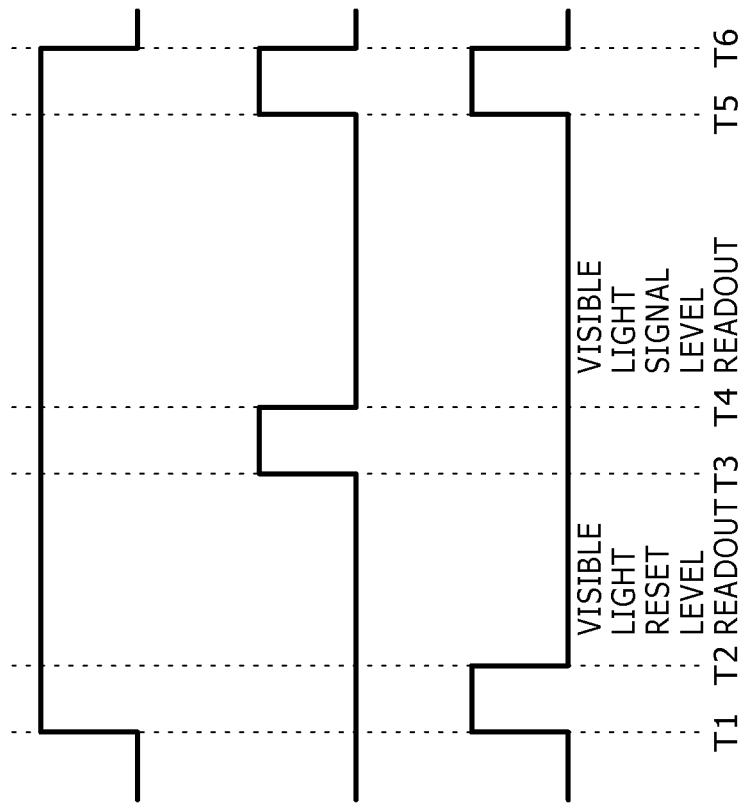

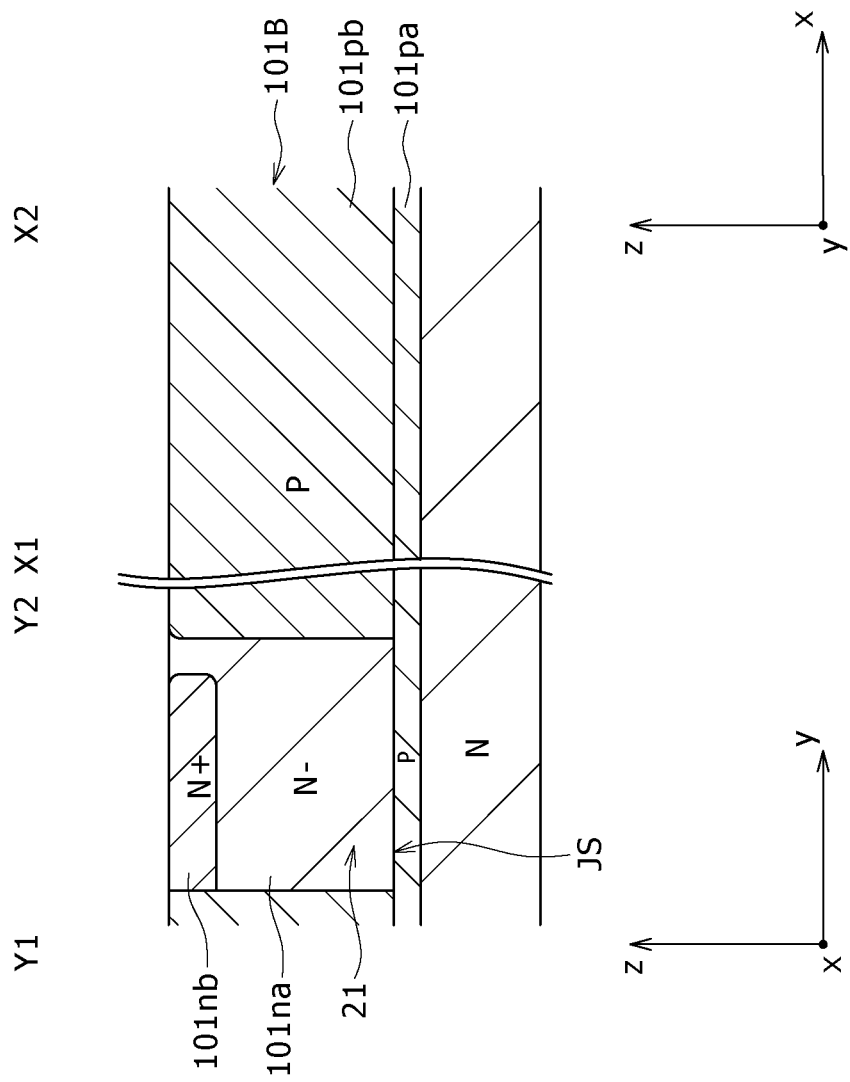

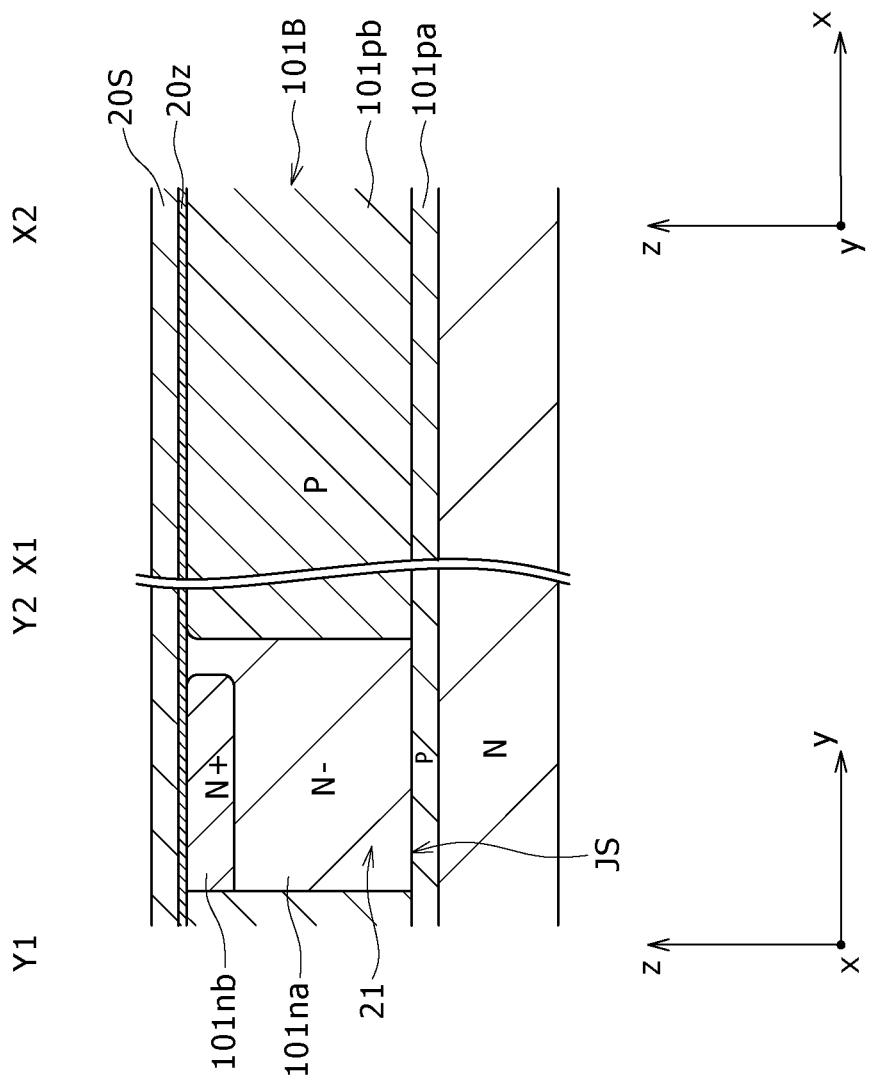

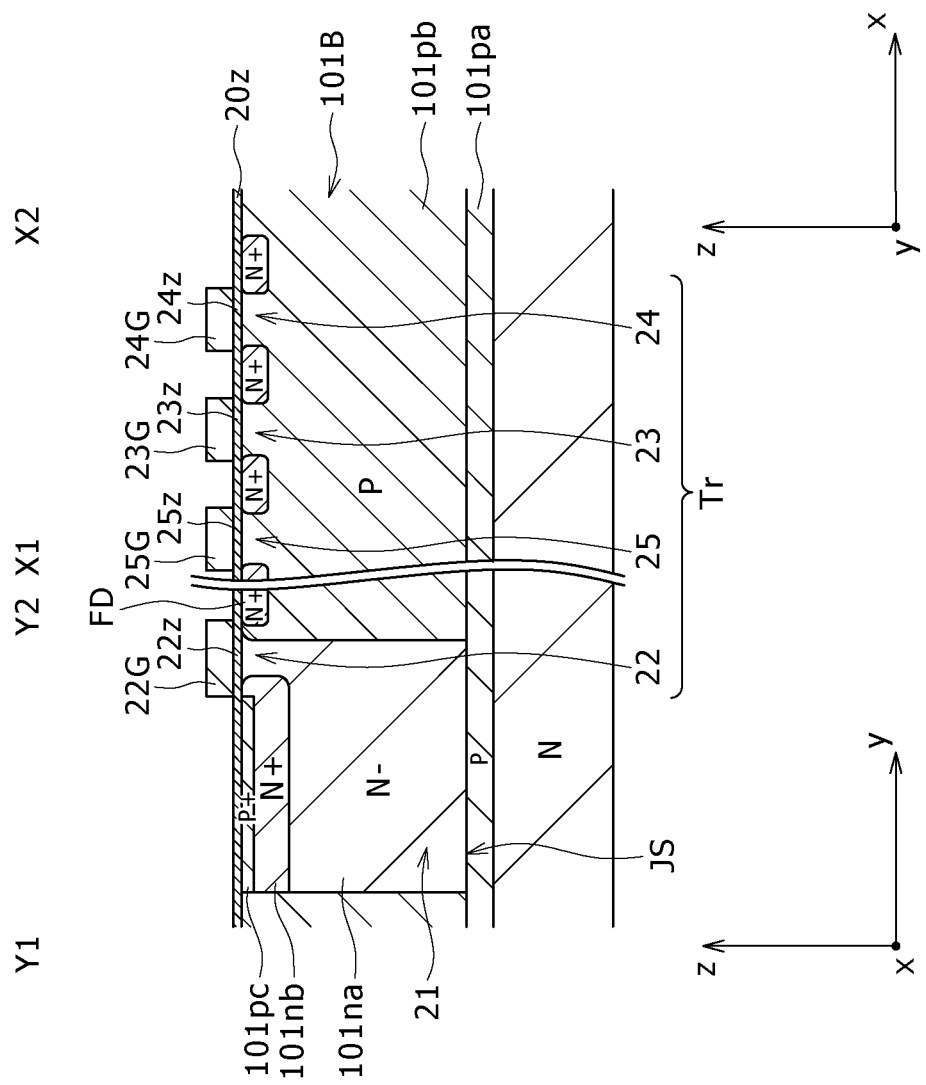

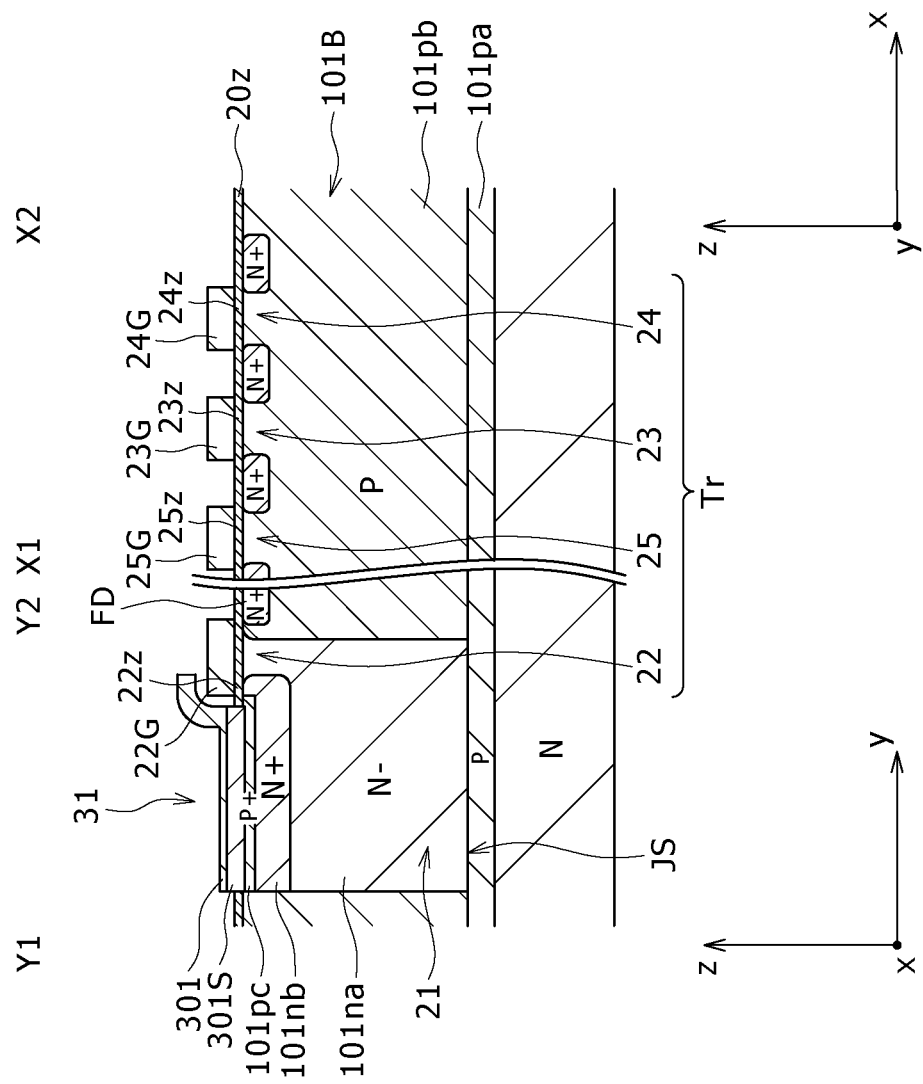

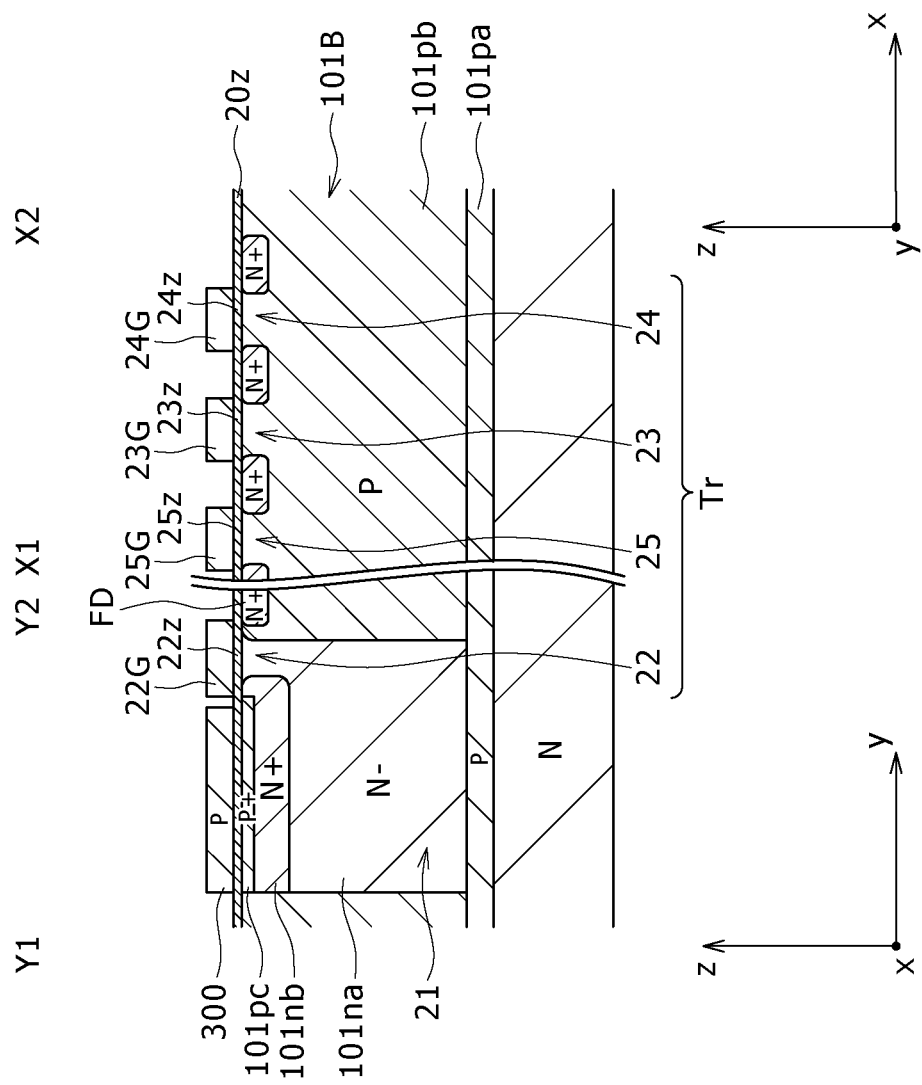

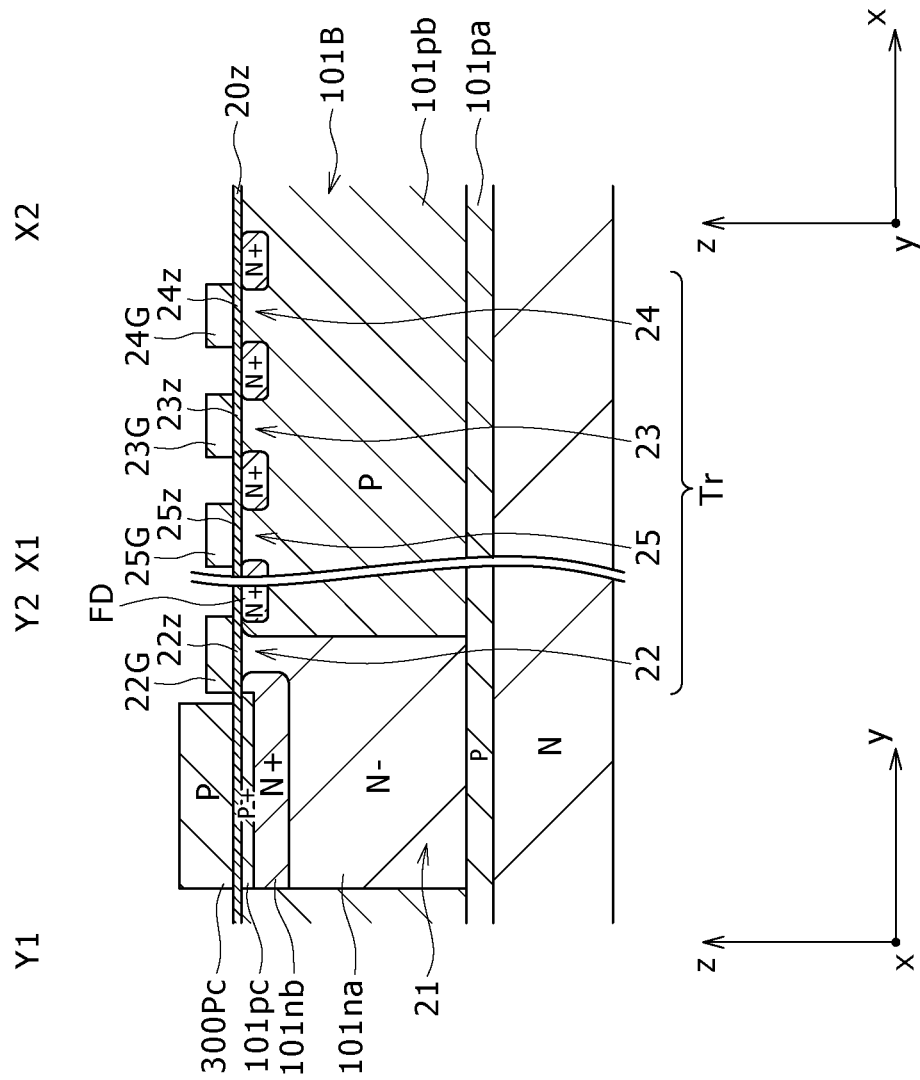

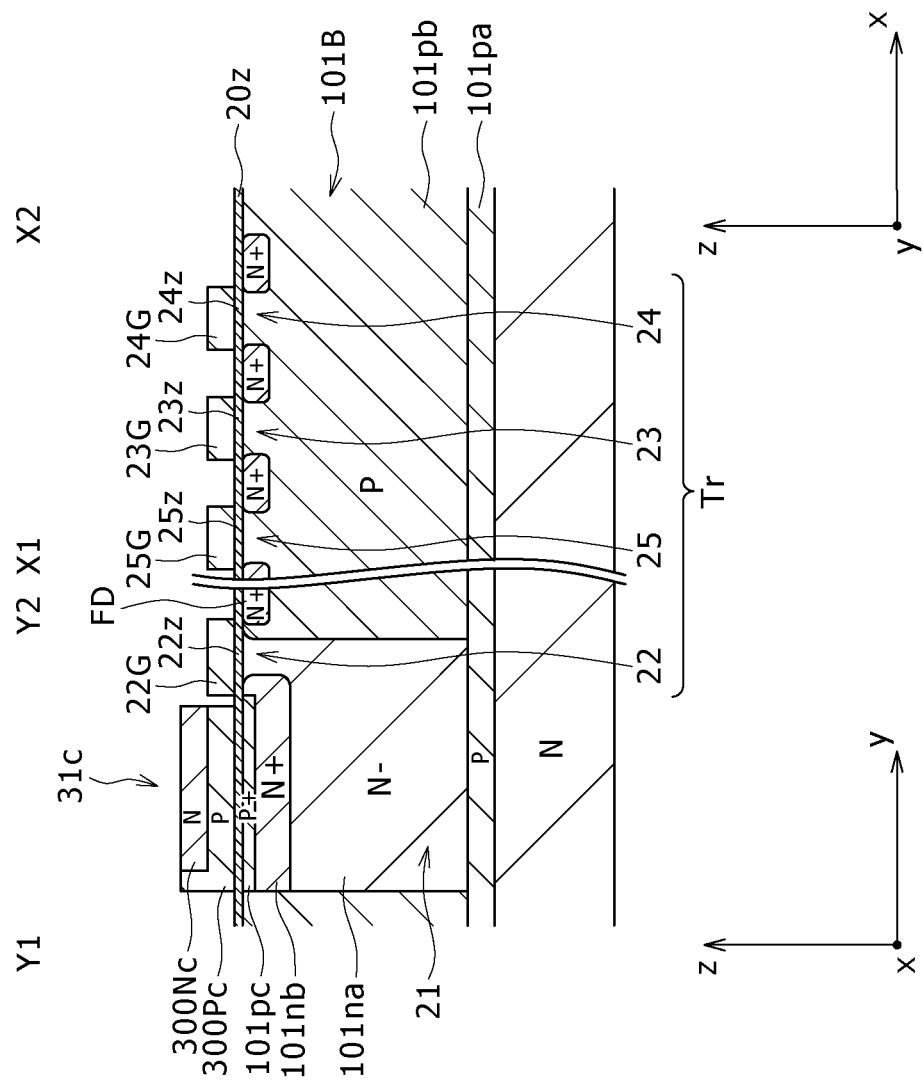

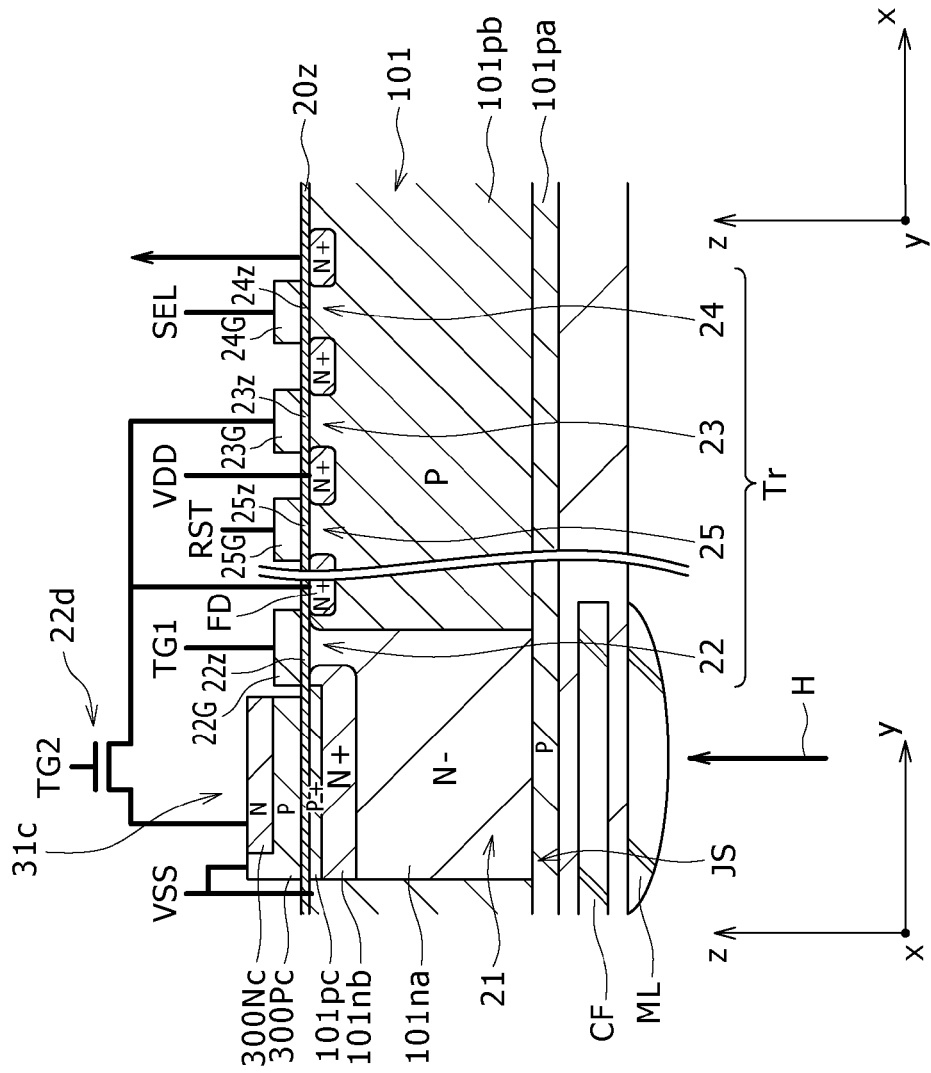

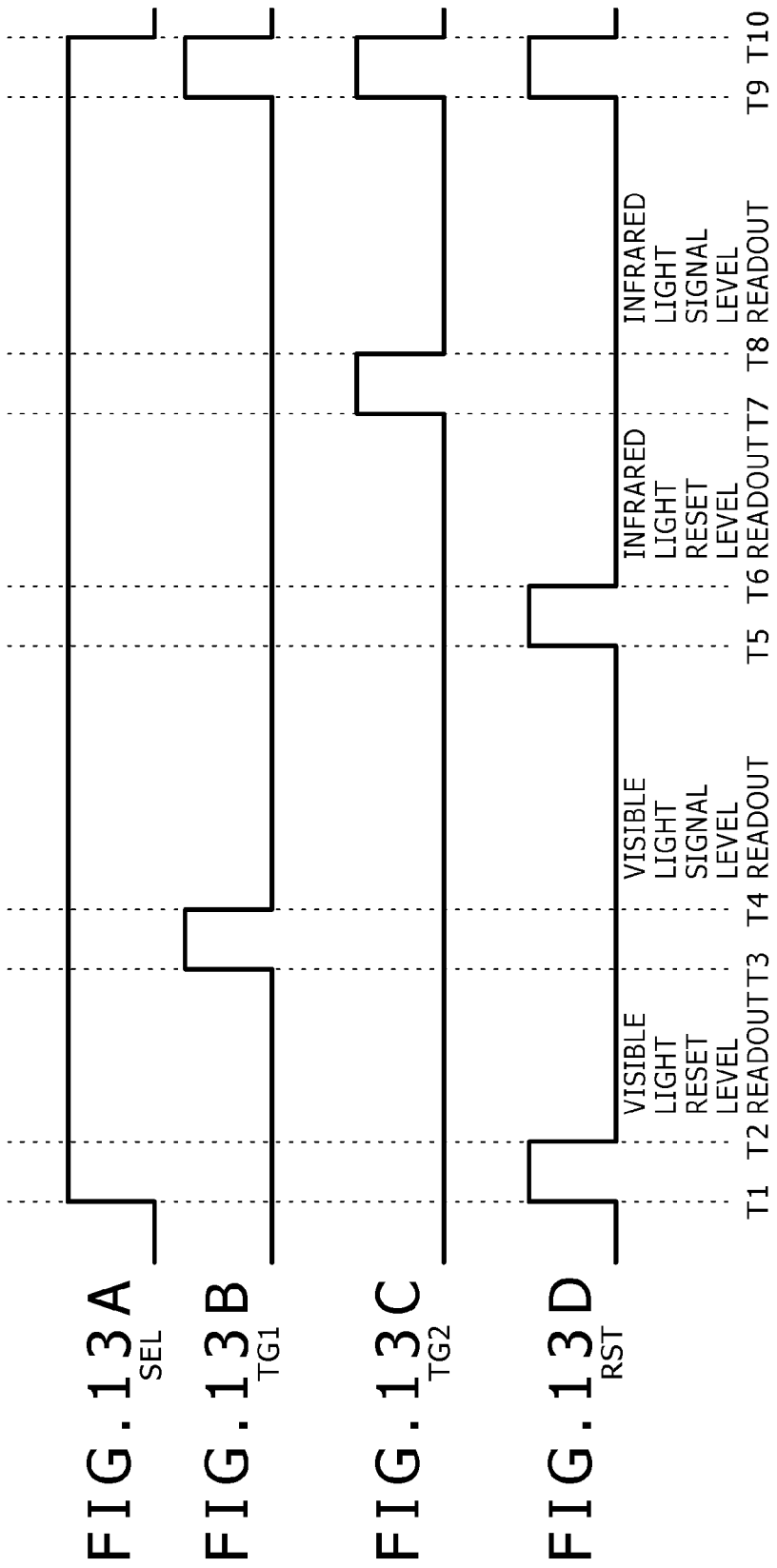

SOLID-STATE IMAGING DEVICE WITH PHOTOELECTRIC CONVERSION SECTION, METHOD OF MANUFACTURING THE SAME, AND ELECTRONIC DEVICE WITH PHOTOELECTRIC CONVERSION SECTION

BACKGROUND

The present disclosure relates to a solid-state imaging device, a method of manufacturing the same, and an electronic device.

Electronic devices such as a digital video camera, a digital still camera, and the like include a solid-state imaging device. The solid-state imaging device includes for example a CMOS (Complementary Metal Oxide Semiconductor) image sensor and a CCD (Charge Coupled Device) image sensor.

The solid-state imaging device has a plurality of pixels arranged in an imaging plane. Each pixel includes a photoelectric conversion section. The photoelectric conversion section is for example a photodiode. The photoelectric conversion section receives light made incident via an external optical system on a light receiving surface, and subjects the light to photoelectric conversion. The photoelectric conversion section thereby generates a signal charge.

Of solid-state imaging devices, a CMOS image sensor has pixels configured to include not only a photoelectric conversion section but also a pixel transistor. The pixel transistor is configured to read out a signal charge generated in the photoelectric conversion section and output the signal charge to a signal line as an electric signal.

Solid-state imaging devices of a "frontside illumination type" and a "backside illumination type" are known. In the "frontside illumination type," a photoelectric conversion section receives incident light made incident from the top surface side of a semiconductor substrate on which top surface side a pixel transistor, wiring, and the like are provided. Thus, in the case of the "frontside illumination type," it may be difficult to improve sensitivity because the wiring and the like decrease an aperture ratio. On the other hand, in the case of the "backside illumination type," sensitivity can be improved because a photoelectric conversion section receives incident light made incident from a bottom surface side on an opposite side from the top surface of a semiconductor substrate on which top surface a pixel transistor, wiring, and the like are provided (see Japanese Patent No. 3759435, for example).

A solid-state imaging device as described above has an effective pixel region and an optical black region provided in an imaging plane. The effective pixel region has effective pixels arranged therein, in which effective pixels a photoelectric conversion section receives incident light. The optical black region is provided on a part of the periphery of the effective pixel region, and has optical black (OB) pixels arranged therein, which OB pixels are provided with a light shielding layer for shielding a photoelectric conversion section from incident light. A black level reference signal is output from the OB pixels. The solid-state imaging device corrects signals output from the effective pixels with the signals output from the OB pixels as a reference so as to remove noise components such as a dark current and the like (see Japanese Patent Laid-Open No. 2005-347708, for example).

SUMMARY

In the "backside illumination type" solid-state imaging device, a semiconductor layer is thinned because the image quality of a picked-up image may be decreased due to the dependence of sensitivity on an angle of incidence when the semiconductor layer in which a photodiode is provided is thick. For example, in a case where visible light is received, the photodiode is provided in the semiconductor layer having a thickness of 5 to 15 μm.

Thus, in the "backside illumination type" solid-state imaging device, the light of a long-wavelength component of incident light made incident from the bottom surface side of the semiconductor layer may be transmitted to the top surface side of the semiconductor layer, and reflected by wiring provided to the top surface of the semiconductor layer. For example, infrared light having a longer wavelength than the light of a visible light component may be transmitted and reflected by the wiring. When the light is reflected by the wiring, the reflected light may be mixed in other pixels, and thus color mixture may occur. Thus, there may be a degradation in image quality such as a degradation in the color reproducibility of a picked-up image.

In addition, the mixing of the above-described reflected light in the optical black (OB) pixels means variations in value of the black level signals detected in the OB pixels. Therefore, noise components may not be removed properly, so that the image quality of a picked-up image may be degraded.

Thus, it can be difficult to improve the image quality of a picked-up image in the "backside illumination type" solid-state imaging device.

It is therefore desirable to provide a solid-state imaging device, a method of manufacturing the same, and an electronic device that can improve the image quality of a picked-up image and the like.

According to an embodiment of the present technology, there is provided a solid-state imaging device including: a semiconductor layer including a photoelectric conversion section receiving incident light and generating a signal charge; and a light absorbing section for absorbing transmitted light transmitted by the photoelectric conversion section and having a longer wavelength than light absorbed by the photoelectric conversion section, the transmitted light being included in the incident light, the light absorbing section being disposed on a side of another surface of the semiconductor layer on an opposite side from one surface of the semiconductor layer, the incident light being made incident on the one surface of the semiconductor layer.

According to an embodiment of the present technology, there is provided a solid-state imaging device manufacturing method including: forming a semiconductor layer including a photoelectric conversion section receiving incident light and generating a signal charge; and forming a light absorbing section for absorbing transmitted light transmitted by the photoelectric conversion section and having a longer wavelength than light absorbed by the photoelectric conversion section, the transmitted light being included in the incident light, the light absorbing section being disposed on a side of another surface of the semiconductor layer on an opposite side from one surface of the semiconductor layer, the incident light being made incident on the one surface of the semiconductor layer.

According to an embodiment of the present technology, there is provided an electronic device including: a semiconductor layer including a photoelectric conversion section receiving incident light and generating a signal charge; and a light absorbing section for absorbing transmitted light transmitted by the photoelectric conversion section and having a longer wavelength than light absorbed by the photoelectric conversion section, the transmitted light being included in the incident light, the light absorbing section being disposed on a side of another surface of the semiconductor layer on an opposite side from one surface of the semiconductor layer, the incident light being made incident on the one surface of the semiconductor layer.

In the present technology, a photoelectric conversion section in a semiconductor layer receives incident light and generates a signal charge. A light absorbing section absorbs transmitted light transmitted by the photoelectric conversion section and having a longer wavelength than light absorbed by the photoelectric conversion section, the transmitted light being included in the incident light, on a side of another surface of the semiconductor layer on an opposite side from one surface of the semiconductor layer, the incident light being made incident on the one surface of the semiconductor layer.

According to the present technology, it is possible to provide a solid-state imaging device, a method of manufacturing the same, and an electronic device that can improve the image quality of a picked-up image and the like.

BRIEF DESCRIPTION OF THE DRAWINGS

FIG. 5 is a diagram showing principal parts of the solid-state imaging device in the first embodiment of the present disclosure;

FIGS. 6A, 6B, and 6C are diagrams showing the operation of the solid-state imaging device in the first embodiment of the present disclosure;

FIGS. 7A to 7F are diagrams of a method of manufacturing the solid-state imaging device in the first embodiment of the present disclosure;

FIGS. 9A and 9B are diagrams of a method of manufacturing the solid-state imaging device in the second embodiment of the present disclosure;

FIGS. 11A and 11B are diagrams of a method of manufacturing the solid-state imaging device in the third embodiment of the present disclosure;

FIG. 12 is a diagram showing principal parts of a solid-state imaging device in a fourth embodiment of the present disclosure;

FIGS. 13A, 13B, 13C, and 13D are diagrams showing the operation of the solid-state imaging device in the fourth embodiment of the present disclosure.

DETAILED DESCRIPTION OF THE PREFERRED EMBODIMENTS

Preferred embodiments of the present disclosure will be described with reference to the drawings.

Incidentally, description will be made in the following order.

1. First Embodiment (Schottky Junction)
2. Second Embodiment (Schottky Junction with Intervening Insulating Film)
3. Third Embodiment (PN Junction)
4. Fourth Embodiment (Picking Up Both of Visible Light Image and Infrared Image)
5. Fifth Embodiment (Covering Transfer Gate)
6. Others <1. First Embodiment>
(1) Device Configuration
(1-1) Configuration of Principal Parts of Camera FIG. 1 is a block diagram showing a configuration of a camera 40 in a first embodiment of the present disclosure.

Figure 1:
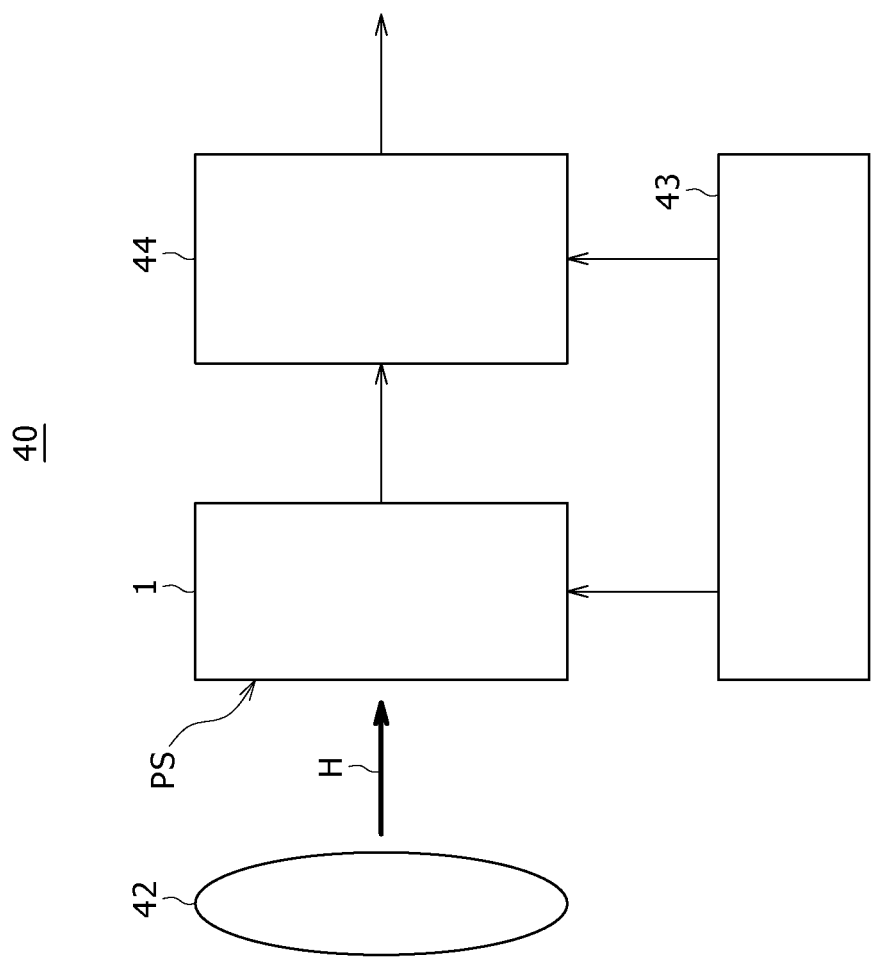
FIG. 1 is a block diagram showing a configuration of a camera in a first embodiment of the present disclosure.

As shown in FIG. 1, the camera 40 is an electronic device, and the camera 40 includes a solid-state imaging device 1, an optical system 42, a control section 43, and a signal processing circuit 44.

The solid-state imaging device 1 receives incident light H made incident as a subject image via the optical system 42 on an imaging surface PS, subjects the incident light H to photoelectric conversion, and thereby generates a signal charge. In addition, the solid-state imaging device 1 is driven on the basis of a control signal output from the control section 43 to read out the signal charge and output the signal charge as raw data.

The optical system 42 includes optical members such as an image forming lens, a diaphragm, and the like. The optical system 42 is arranged so as to condense the light formed by the incident subject image on the imaging surface PS of the solid-state imaging device 1.

The control section 43 outputs various control signals to the solid-state imaging device 1 and the signal processing circuit 44, and thereby controls and drives the solid-state imaging device 1 and the signal processing circuit 44.

The signal processing circuit 44 is configured to generate a digital color image of the subject image by subjecting the raw data output from the solid-state imaging device 1 to signal processing.

(1-2) Configuration of Principal Parts of Solid-State Imaging Device

A general configuration of the solid-state imaging device 1 will be described.

Figure 2:
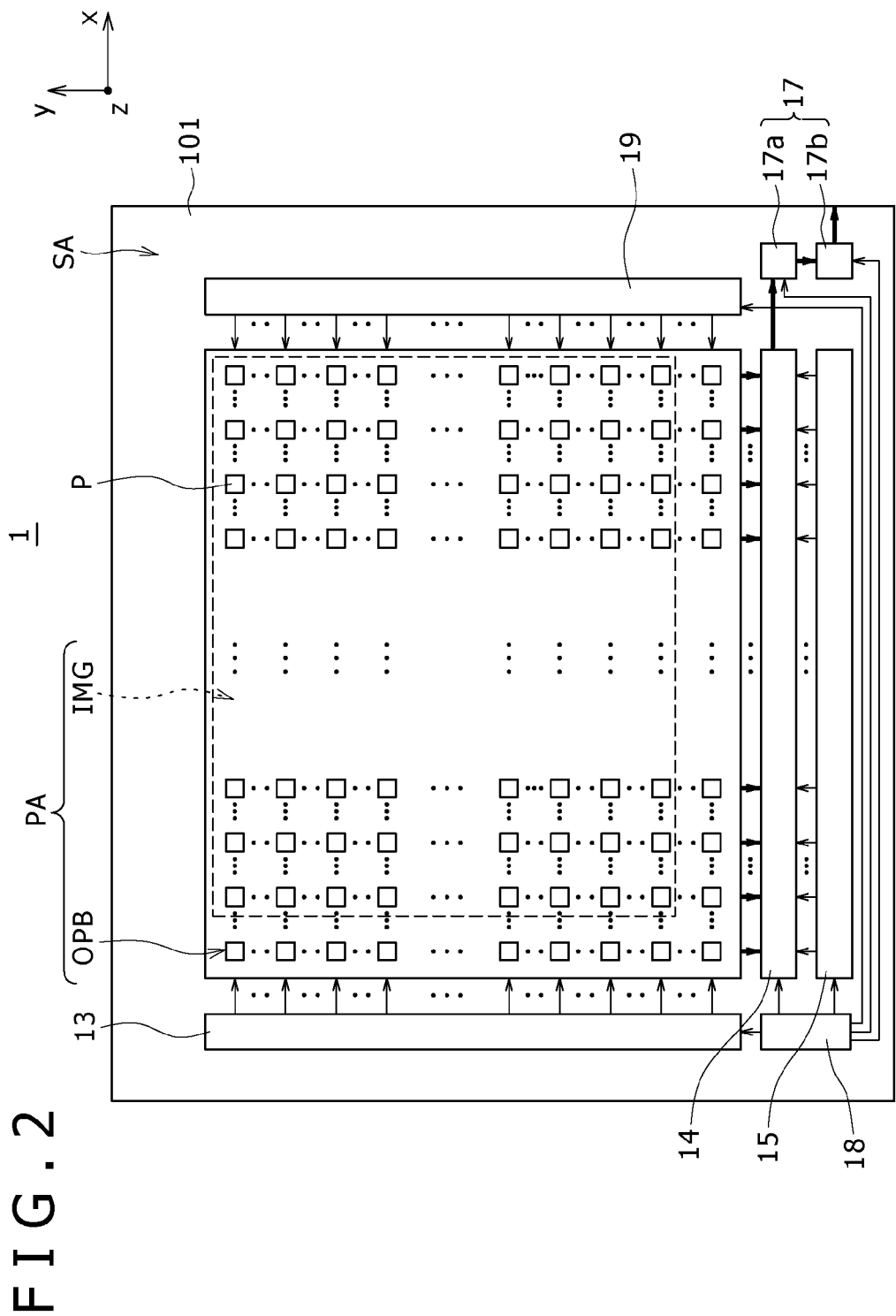
FIG. 2 is a block diagram showing a general configuration of a solid-state imaging device in the first embodiment of the present disclosure.

FIG. 2 is a block diagram showing a general configuration of the solid-state imaging device 1 in the first embodiment of the present disclosure.

The solid-state imaging device 1 according to the present embodiment is a CMOS type image sensor, and includes a semiconductor layer 101, as shown in FIG. 2. This semiconductor layer 101 is for example formed by a semiconductor substrate made of silicon. As shown in FIG. 2, the semiconductor layer 101 has a pixel region PA and a peripheral region SA.

As shown in FIG. 2, the pixel region PA is in a rectangular shape, and has a plurality of pixels P arranged therein in each of a horizontal direction x and a vertical direction y. That is, the pixels P are arranged in the form of a matrix. The pixel region PA is disposed such that the center of the pixel region PA corresponds to the optical axis of the optical system 42.

In the pixel region PA, the pixels P are configured to receive incident light H and generate a signal charge. The generated signal charge is read and output by a pixel transistor (not shown). A detailed configuration of the pixels P will be described later.

In the present embodiment, the pixel region PA includes an effective pixel region IMG and an optical black region OPB.

In the effective pixel region IMG of the pixel region PA, the pixels P are arranged as so-called effective pixels. That is, in the effective pixel region IMG, the upper parts of the pixels P are opened, and the pixels P receive the incident light H made incident from above, whereby imaging is performed.

In the pixel region PA, the optical black region OPB is provided on the periphery of the effective pixel region IMG, as shown in FIG. 2. In this case, the optical black region OPB is for example provided in parts below and on the left side of the effective pixel region IMG. The optical black region OPB has a light shielding film (not shown) provided over the pixels P to prevent the incident light from being made directly incident on the pixels P.

The pixels P in the optical black region OPB are arranged as so-called optical black (OB) pixels. That is, a black level reference signal is output from the pixels P in the optical black region OPB. The black level reference signal output from the pixels P is used to perform correction processing on signals output from the effective pixels so as to remove noise components such as a dark current and the like.

As shown in FIG. 2, the peripheral region SA is situated on the periphery of the pixel region PA. A peripheral circuit is provided in the peripheral region SA.

Specifically, as shown in FIG. 2, a vertical driving circuit 13, a column circuit 14, a horizontal driving circuit 15, an external output circuit 17, a timing generator (TG) 18, and a shutter driving circuit 19 are provided as the peripheral circuit.

As shown in FIG. 2, the vertical driving circuit 13 in the peripheral region SA is provided on the side of the pixel region PA. The vertical driving circuit 13 is configured to select and drive the pixels P in the pixel region PA in row units.

As shown in FIG. 2, the column circuit 14 in the peripheral region SA is provided in the vicinity of the lower end part of the pixel region PA. The column circuit 14 performs signal processing on signals output from the pixels P in column units. The column circuit 14 in this case includes a CDS (Correlated Double Sampling) circuit (not shown), and performs signal processing to remove fixed pattern noise.

As shown in FIG. 2, the horizontal driving circuit 15 is electrically connected to the column circuit 14. The horizontal driving circuit 15 includes a shift register, for example. The horizontal driving circuit 15 sequentially outputs the signals retained for each column of the pixels P in the column circuit 14 to the external output circuit 17.

As shown in FIG. 2, the external output circuit 17 is electrically connected to the column circuit 14. The external output circuit 17 performs signal processing on the signals output from the column circuit 14, and thereafter outputs the signals to the outside. The external output circuit 17 includes an AGC (Automatic Gain Control) circuit 17a and an ADC (Analog/Digital Conversion) circuit 17b. In the external output circuit 17, the AGC circuit 17a subjects the signals to gain control, and thereafter the ADC circuit 17b converts the signals from analog signals to digital signals and outputs the digital signals to the outside.

As shown in FIG. 2, the timing generator 18 is electrically connected to each of the vertical driving circuit 13, the column circuit 14, the horizontal driving circuit 15, the external output circuit 17, and the shutter driving circuit 19. The timing generator 18 generates various timing signals, and outputs the timing signals to the vertical driving circuit 13, the column circuit 14, the horizontal driving circuit 15, the external output circuit 17, and the shutter driving circuit 19. The timing generator 18 thereby drives and controls each of the parts.

The shutter driving circuit 19 is configured to select the pixels P in row units and adjust exposure time in the pixels P.

(1-3) Detailed Configuration of Solid-State Imaging Device

Details of the solid-state imaging device according to the present embodiment will be described.

Figure 3:
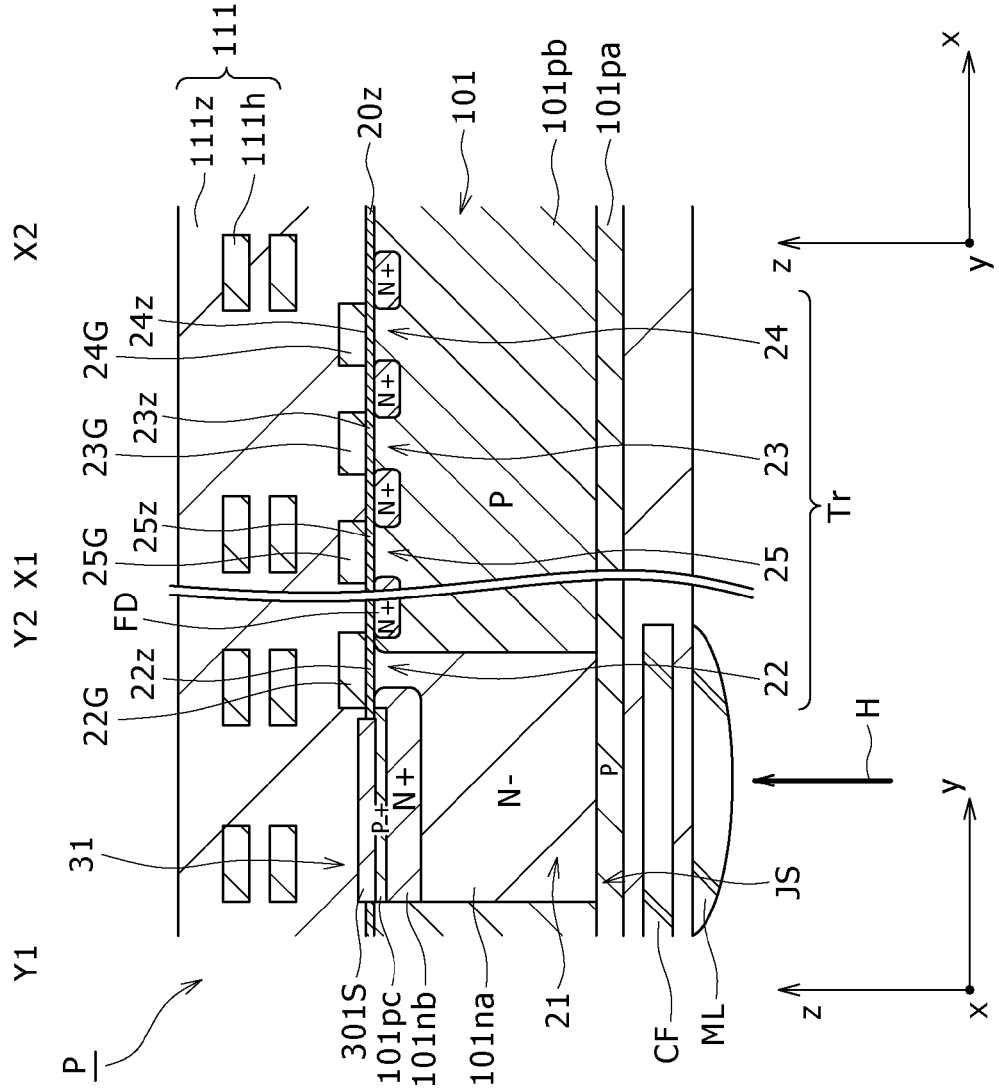
FIG. 3 is a diagram showing principal parts of the solid-state imaging device in the first embodiment of the present disclosure.
Figure 4:
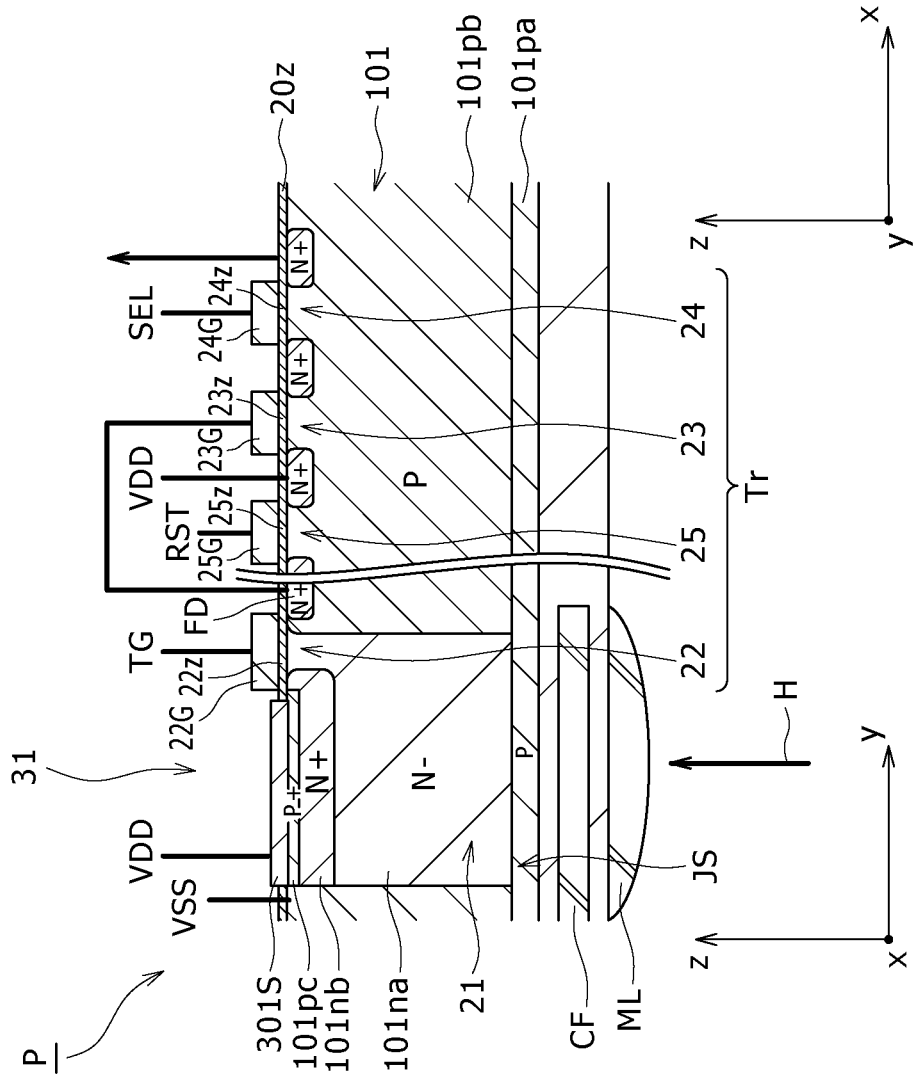
FIG. 4 is a diagram showing principal parts of the solid-state imaging device in the first embodiment of the present disclosure.

FIGS. 3 to 5 are diagrams showing principal parts of the solid-state imaging device in the first embodiment of the present disclosure.

FIG. 3 shows the section of a pixel P provided in the effective pixel region IMG of the pixel region PA. That is, FIG. 3 shows the section of a pixel P provided as an effective pixel.

FIG. 4 shows the electric connection relation of each part together with the section of the pixel P provided as an effective pixel. For the convenience of description, a wiring layer 111 shown in FIG. 3 is not shown in FIG. 4.

FIG. 5 shows the top surface of the pixel P provided as an effective pixel. The sections of a part Y1-Y2 and a part X1-X2 shown in FIG. 5 are shown in FIG. 3 and FIG. 4.

Details of the optical black region OPB in the pixel region PA are not shown. However, in contrast to the pixel P in the effective pixel region IMG shown in FIG. 3 and FIG. 4, a color filter CF and an on-chip lens ML are not provided in the optical black region OPB. A light shielding film (not shown) for shielding pixels P from the incident light H is provided in the optical black region OPB. Each part in the optical black region OPB is otherwise formed in a similar manner to each part in the effective pixel region IMG.

As shown in each figure, the solid-state imaging device 1 includes a photodiode 21, a pixel transistor Tr, and an infrared absorbing section 31. The pixel transistor Tr in this case includes a transfer transistor 22, an amplifying transistor 23, a selecting transistor 24, and a reset transistor 25, and is configured to read out a signal charge from the photodiode 21.

In the present embodiment, as shown in FIG. 3 and FIG. 4, the solid-state imaging device 1 has the pixel transistor Tr such as the transfer transistor 22 and the like disposed on the top surface side (upper surface side in the figures) of the semiconductor layer 101. The wiring layer 111 is provided to the top surface side of the semiconductor layer 101. The photodiode 21 is provided so as to receive the incident light H made incident from the bottom surface side (lower surface side in FIG. 3 and FIG. 4) as an opposite side from the top surface side on a light receiving surface JS.

That is, the solid-state imaging device 1 according to the present embodiment is a "backside illumination type CMOS image sensor."

Each part will be described in order.

(a) Photodiode 21

In the solid-state imaging device 1, the photodiode 21 is provided for each of the plurality of pixels P shown in FIG. 2. That is, photodiodes 21 are provided in an imaging plane (xy plane) so as to form lines in the horizontal direction x and the vertical direction y orthogonal to the horizontal direction x.

The photodiode 21 is configured to receive the incident light H on the light receiving surface JS, generate a signal charge by performing photoelectric conversion, and store the signal charge. The photodiode 21 in this case is configured to receive the light of a visible light component made incident as a subject image in the incident light H and perform photoelectric conversion.

As shown in FIG. 3, the photodiode 21 is for example provided within the semiconductor layer 101, which is a single crystal silicon semiconductor. For example, the photodiode 21 is provided in the semiconductor layer 101 thinned to a thickness of 5 to 15 μm. Specifically, the photodiode 21 includes n-type charge accumulating regions 101*na* and 101*nb*. The n-type charge accumulating regions 101*na* and 101*nb* are provided within p-type semiconductor regions 101*pa* and 101*pb* of the semiconductor layer 101. That is, the p-type semiconductor region 101*pa* and the n-type charge accumulating regions 101*na* and 101*nb* are formed sequentially from the bottom surface side (lower surface in FIG. 3) to the top surface side (upper surface in FIG. 3) in the semiconductor layer 101. In addition, the n-type charge accumulating regions 101*na* and 101*nb* are formed so as to increase in impurity concentration from the bottom surface side to the top surface side of the semiconductor layer 101.

A p-type semiconductor region 101*pc* having a higher impurity concentration than the p-type semiconductor regions 101*pa* and 101*pb* is provided as a hole accumulating layer in the n-type charge accumulating regions 101*na* and 101*nb* on the top surface side of the semiconductor layer 101. That is, the high-concentration p-type semiconductor region 101*pc* is formed closer to the top surface than the n-type charge accumulating regions 101*na* and 101*nb* in the semiconductor layer 101.

The photodiode 21 is thus formed with a so-called HAD (Hall Accumulated Diode) structure.

As shown in FIGS. 3 to 5, a signal charge accumulated in each photodiode 21 is transferred to a floating diffusion FD by the transfer transistor 22.

The photodiodes 21 are provided in both of the effective pixel region IMG and the optical black region OPB (see FIG. 2) in a similar manner. In addition, a reverse bias is applied to the photodiodes 21.

(b) Pixel Transistor Tr

In the solid-state imaging device 1, the pixel transistor Tr is provided in each of the plurality of pixels P shown in FIG. 2. As shown in each figure, the transfer transistor 22, the amplifying transistor 23, the selecting transistor 24, and the reset transistor 25 are provided as the pixel transistor Tr.

Each of the transistors 22 to 25 forming the pixel transistor Tr is provided on the top surface side of the semiconductor layer 101, as shown in FIG. 3 and FIG. 4. As shown in FIG. 5, each of the transistors is provided so as to be situated below the photodiode 21 in the imaging plane (xy plane). Each of the transistors 22 to 25 is formed as an N-channel MOS transistor, for example.

For example, an activation region (not shown) is formed in a region for separation between pixels P in the semiconductor layer 101, and respective gate electrodes 22G, 23G, 24G, and 25G of the transistors 22 to 25 are formed by using polysilicon. Incidentally, though not shown, sidewalls (not shown) are formed on side parts of the respective gate electrodes 22G, 23G, 24G, and 25G.

These transistors 22 to 25 are provided in both of the effective pixel region IMG and the optical black region OPB (see FIG. 2) in a similar manner.

(b-1) Transfer Transistor 22

In the pixel transistor Tr, as shown in FIG. 3, the transfer transistor 22 is provided on the top surface side of the semiconductor layer 101.

In this case, as shown in FIG. 3, the gate electrode 22G of the transfer transistor 22 is provided to the top surface of the semiconductor layer 101 with a gate insulating film 22*z* interposed between the gate electrode 22G and the semiconductor layer 101.

As shown in FIG. 3, the gate electrode 22G of the transfer transistor 22 is provided so as to be adjacent to the floating diffusion FD provided in the top surface of the semiconductor layer 101. The gate electrode 22G is provided to a channel formation region of the transfer transistor 22 for transferring a signal charge from the photodiode 21 to the floating diffusion FD with the gate insulating film 22*z* interposed between the gate electrode 22G and the channel formation region.

As shown in FIG. 4, the transfer transistor 22 is configured to output the signal charge generated in the photodiode 21 to the gate of the amplifying transistor 23 as an electric signal.

Specifically, the gate of the transfer transistor 22 is supplied with a transfer signal TG from a transfer line (not shown), and thereby transfers the signal charge accumulated in the photodiode 21 to the floating diffusion FD. The floating diffusion FD converts the charge into a voltage, and inputs the voltage to the gate of the amplifying transistor 23 as an electric signal.

(b-2) Amplifying Transistor 23

In the pixel transistor Tr, as shown in FIG. 3, the amplifying transistor 23 is provided on the top surface side of the semiconductor layer 101.

As shown in FIG. 3, the gate electrode 23G of the amplifying transistor 23 is provided to the top surface of the semiconductor layer 101 with a gate insulating film 23*z* interposed between the gate electrode 23G and the semiconductor layer 101. The amplifying transistor 23 is provided between the selecting transistor 24 and the reset transistor 25 provided to the top surface of the semiconductor layer 101.

As shown in FIG. 4, the amplifying transistor 23 is configured to amplify and output an electric signal obtained by the conversion from the charge to the voltage in the floating diffusion FD.

Specifically, the gate of the amplifying transistor 23 is electrically connected to the floating diffusion FD by wiring. In addition, the drain of the amplifying transistor 23 is electrically connected to a power supply line (not shown), to which a power supply potential VDD is applied. In addition, the source of the amplifying transistor 23 is electrically connected to the drain of the selecting transistor 24. When the selecting transistor 24 is set in an on state by a selecting signal SEL, the amplifying transistor 23 is supplied with a constant current, and operates as a source follower. Thus, the amplifying transistor 23 amplifies the electric signal obtained by the conversion from the charge to the voltage in the floating diffusion FD.

(b-3) Selecting Transistor 24

In the pixel transistor Tr, as shown in FIG. 3, the selecting transistor 24 is provided on the top surface side of the semiconductor layer 101.

In this case, as shown in FIG. 3, the gate electrode 24G of the selecting transistor 24 is provided to the top surface of the semiconductor layer 101 with a gate insulating film 24*z* interposed between the gate electrode 24G and the semiconductor layer 101. The selecting transistor 24 is provided so as to be adjacent to the amplifying transistor 23 provided in the top surface of the semiconductor layer 101.

As shown in FIG. 4, the selecting transistor 24 is configured to output the electric signal output from the amplifying transistor 23 to a vertical signal line (not shown) when the selecting signal is input to the selecting transistor 24.

Specifically, the gate of the selecting transistor 24 is electrically connected to an address line (not shown) supplied with the selecting signal SEL. When the selecting transistor 24 is set in an on state by being supplied with the selecting signal SEL, the selecting transistor 24 outputs the output signal amplified by the amplifying transistor 23 as described above to the vertical signal line (not shown).

(b-4) Reset Transistor 25

In the pixel transistor Tr, as shown in FIG. 3, the reset transistor 25 is provided on the top surface side of the semiconductor layer 101.

In this case, as shown in FIG. 3, the gate electrode 25G of the reset transistor 25 is provided to the top surface of the semiconductor layer 101 with a gate insulating film 25z interposed between the gate electrode 25G and the semiconductor layer 101. The reset transistor 25 is provided so as to be adjacent to the amplifying transistor 23 provided in the top surface of the semiconductor layer 101.

As shown in FIG. 4, the reset transistor 25 is configured to reset the gate potential of the amplifying transistor 23.

Specifically, as shown in FIG. 4, the gate of the reset transistor 25 is connected to a reset line (not shown) supplied with a reset signal. In addition, the drain of the reset transistor 25 is electrically connected to the power supply line (not shown), so that the power supply potential VDD is applied to the drain of the reset transistor 25. In addition, the source of the reset transistor 25 is electrically connected to the floating diffusion FD. When the gate of the reset transistor 25 is supplied with the reset signal RST from the reset line (not shown) and thereby the reset transistor 25 is set in an on state, the reset transistor 25 resets the gate potential of the amplifying transistor 23 to the power supply potential VDD via the floating diffusion FD.

(c) Infrared Absorbing Section 31

In the solid-state imaging device 1, the infrared absorbing section 31 is provided in each of the plurality of pixels P shown in FIG. 2.

The infrared absorbing section 31 is configured to absorb infrared light passed through the photodiode 21, which infrared light is included in the incident light H made incident as a subject image. That is, before the light of a longer wavelength than that of a visible light component selectively absorbed by the photodiode 21 is passed through the photodiode 21 and made incident on the wiring layer 111 on the top surface side, the light of the longer wavelength and the visible light component being included in the incident light H made incident from the bottom surface side, the infrared absorbing section 31 selectively absorbs the light of the longer wavelength, and thereby provides a light shielding.

In the present embodiment, as shown in FIG. 3, the infrared absorbing section 31 includes a metallic silicide layer 301S. The metallic silicide layer 301S is provided so as to cover the surface of the p-type semiconductor region 101pc in the semiconductor layer 101.

This metallic silicide layer 301S is provided so as to form a Schottky junction with the p-type semiconductor region 101pc in the semiconductor layer 101. That is, the infrared absorbing section 31 is formed so as to constitute a Schottky diode, with a Schottky barrier formed in a junction part between the metallic silicide layer 301S and the p-type semiconductor region 101pc in the semiconductor layer 101. The infrared absorbing section 31 is formed so as to have a band gap absorbing infrared rays. For example, the infrared absorbing section 31 is formed so as to have a band gap of 0.6 eV (corresponding to a wavelength of 2 μm) or less.

For example, the metallic silicide layer 301S is formed of Pt (platinum) silicide. In addition to Pt (platinum) silicide, the metallic silicide layer 301S may be formed of Co silicide, Pd silicide, or Ir silicide. In addition, a metallic layer formed of a metal such as Au, Ni, Co, Pd, Ir, W or the like may be provided in place of the metallic silicide layer 301S.

In the infrared absorbing section 31, a reverse bias voltage is applied to the Schottky diode. Specifically, as shown in FIG. 4, the metallic silicide layer 301S is electrically connected to the power supply line (not shown), so that the power supply potential VDD is applied to the metallic silicide layer 301S. A leakage of carriers into the photodiode 21 when a floating node is saturated can be thereby prevented.

In addition, as shown in FIG. 5, the metallic silicide layer 301S is formed so as to cover the photodiode 21 in the imaging plane (xy plane).

The infrared absorbing section 31 is provided in both of the effective pixel region IMG and the optical black region OPB (see FIG. 2) in a similar manner.

(d) Others

In addition to the above, as shown in FIG. 3, a color filter CF and an on-chip lens ML are provided so as to correspond to pixels P on the bottom surface side (lower surface side in FIG. 3) of the semiconductor layer 101 in the effective pixel region IMG of the pixel region PA.

The color filter CF for example includes filter layers of three primary colors. The filter layers of three primary colors are arranged in the respective pixels P in a Bayer arrangement. The color filter CF is for example formed by applying a coating liquid including a coloring pigment and a photoresist resin by a coating method such as a spin coating method or the like, thereby forming a coating film, and thereafter subjecting the coating film to pattern processing by lithography technology.

As shown in FIG. 3, the on-chip lens ML is a convex lens whose center is thicker than an edge thereof, and is configured to condense the incident light H onto the light receiving surface JS of the photodiode 21 via the color filter CF.

For example, the on-chip lens ML is formed by using a transparent organic material such as a styrene resin, an acrylic resin, a novolac resin or the like. In addition, the on-chip lens ML may be formed by using a transparent inorganic material such as $SiO_2$, SiN, SiON, SiCN, HfO or the like.

In addition, as shown in FIG. 3, the wiring layer 111 is provided to the top surface of the semiconductor layer 101 so as to cover the pixel transistor Tr and the infrared absorbing section 31 described above. In the wiring layer 111, a plurality of pieces of wiring 111h electrically connected to respective elements are provided between a plurality of interlayer insulating films (not shown) forming an insulating layer 111z. That is, the wiring layer 111 is formed by alternately stacking the interlayer insulating films (not shown) and the pieces of wiring 111h. Each of the pieces of wiring 111h is formed in a laminated state so as to function as wiring such as the transfer line, the address line, the vertical signal line, and the reset line electrically connected to the pixel transistor Tr, for example. In addition, a supporting substrate (not shown) is laminated for reinforcement to the surface of the wiring layer 111 on the opposite side from the surface of the wiring layer 111 to which surface the semiconductor layer 101 is provided.

Incidentally, in contrast to the pixels P of the effective pixel region IMG shown in FIG. 3 and FIG. 4, the color filter CF and the on-chip lens ML are not provided in the optical black region OPB of the pixel region PA. The optical black region OPB is provided with a light shielding film (not shown) for shielding the pixels P from the incident light H.

FIGS. 6A, 6B, and 6C are diagrams showing the operation of the solid-state imaging device 1 in the first embodiment of the present disclosure.

FIGS. 6A, 6B, and 6C are a timing chart showing pulse signals supplied to the respective parts when a signal is read out from the pixel P. FIG. 6A shows the selecting signal SEL input to the gate of the selecting transistor 24. FIG. 6B shows the transfer signal TG input to the gate of the transfer transistor 22. FIG. 6C shows the reset signal RST input to the gate of the reset transistor 25.

First, as shown in FIGS. 6A to 6C, at a first time point T1, the selecting signal SEL and the reset signal RST at a high level are transmitted to set the selecting transistor 24 and the reset transistor 25 in an on state. The gate potential of the amplifying transistor 23 is thereby reset.

Next, at a second time point T2, the reset signal RST is set to a low level to set the reset transistor 25 in an off state. Thereafter, a voltage corresponding to a reset level is output to the column circuit 14 as an output signal.

Next, at a third time point T3, the transfer signal TG at a high level is transmitted to set the transfer transistor 22 in an on state. A signal charge accumulated in the photodiode 21 is thereby transferred to the floating diffusion FD.

Next, at a fourth time point T4, the transfer signal TG is set to a low level to set the transfer transistor 22 in an off state. A voltage having a signal level corresponding to the quantity of the transferred signal charge is thereafter output to the column circuit 14 as an output signal.

Next, at a fifth time point T5, the transfer signal TG and the reset signal RST are set to a high level to set the transfer transistor 22 and the reset transistor 25 in an on state.

Thereafter, at a sixth time point T6, the selecting signal SEL, the transfer signal TG, and the reset signal RST are set to a low level to set the selecting transistor 24, the transfer transistor 22, and the reset transistor 25 in an off state.

The column circuit 14 subjects the signal having the reset level read out first and the signal having the signal level read out later to difference processing, and stores a signal resulting from the difference processing. A fixed pattern noise caused by for example variation in Vth of each transistor provided to each pixel P is thereby cancelled out.

Because the gates of the respective transistors 22, 24, and 25 are connected in a row unit composed of a plurality of pixels P arranged in the horizontal direction x, the operation of driving the pixel P as described above is performed simultaneously for the plurality of pixels P arranged in the row unit.

Specifically, the pixels P are selected sequentially in horizontal lines (pixel rows) in the vertical direction by the selecting signal supplied by the vertical driving circuit 13 described above. Then, the transistors of each pixel P are controlled by various timing signals output from the timing generator 18. An output signal in each pixel is thereby output to the column circuit 14 in each column of pixels P through the vertical signal line (not shown).

Then, the signal stored in the column circuit 14 is selected by the horizontal driving circuit 15, and sequentially output to the external output circuit 17.

(2) Manufacturing Method

Principal parts of a manufacturing method for manufacturing the solid-state imaging device 1 described above will be described.

FIGS. 7A to 7F are diagrams of the method of manufacturing the solid-state imaging device in the first embodiment of the present disclosure.

As with FIG. 3, FIGS. 7A to 7F show a section. The solid-state imaging device 1 as shown in FIG. 3 and the like is manufactured by sequentially undergoing each step shown in FIGS. 7A to 7F.

(a) Formation of P-Type Semiconductor Regions 101$pa$ and 101$pb$ and the Like

First, as shown in FIG. 7A, p-type semiconductor regions 101$pa$ and 101$pb$ and the like are formed.

In this case, for example, a semiconductor substrate 101B formed of an n-type silicon semiconductor is prepared, and thereafter p-type semiconductor regions 101$pa$ and 101$pb$ and an n-type charge accumulating region 101$na$ are formed in the semiconductor substrate 101B.

For example, the regions 101$pa$, 101$pb$, and 101$na$ are formed so as to be in impurity concentration ranges as shown in the following. Specifically, the regions 101$pa$, 101$pb$, and 101$na$ are formed by ion implantation of impurities.

P-Type Semiconductor Regions 101$pa$ and 101$pb$
Impurity Concentration: $1 \times 10^{16}$ to $1 \times 10^{18}$ cm$^{-3}$ (preferably $5 \times 10^{16}$ to $5 \times 10^{17}$ cm$^{-3}$)

N-Type Charge Accumulating Region 101$na$
Impurity Concentration: $1 \times 10^{15}$ to $1 \times 10^{17}$ cm$^{-3}$ (preferably $5 \times 10^{15}$ to $5 \times 10^{16}$ cm$^{-3}$)

Then, an n-type charge accumulating region 101$nb$ is provided to form a photodiode 21.

In this case, the n-type charge accumulating region 101$nb$ is provided in a shallow part on the top surface side in the n-type charge accumulating region 101$na$.

For example, the n-type charge accumulating region 101$nb$ is formed by ion-implanting an n-type impurity so as to be in an impurity concentration range as shown in the following.

N-Type Charge Accumulating Region 101$nb$
Impurity Concentration: $1 \times 10^{16}$ to $1 \times 10^{18}$ cm$^{-3}$ (preferably $5 \times 10^{16}$ to $5 \times 10^{17}$ cm$^{-3}$)

(b) Formation of Insulating Film 20$z$ and Polysilicon Film 20S

Next, as shown in FIG. 7B, an insulating film 20$z$ and a polysilicon film 20S are formed.

In this case, the insulating film 20$z$, which is a silicon oxide film, is formed on the top surface of the semiconductor substrate 101B, and thereafter the polysilicon film 20S is formed. The insulating film 20$z$ and the polysilicon film 20S are formed so as to cover regions in which to form the gates of respective transistors 22, 23, 24, and 25 forming a pixel transistor Tr.

Specifically, the insulating film 20$z$ as a silicon oxide film is formed by subjecting the top surface of the semiconductor substrate 101B to thermal oxidation processing. Then, the polysilicon film 20S is formed by a CVD (Chemical Vapor Deposition) method, for example. For example, the polysilicon film 20S is formed so as to include an N-type impurity.

(c) Formation of Pixel Transistor Tr

Next, as shown in FIG. 7C, each of transistors 22, 23, 24, and 25 forming a pixel transistor Tr is formed.

In this case, the gate electrodes 22G, 23G, 24G, and 25G of the respective transistors 22, 23, 24, and 25 are formed by subjecting the polysilicon film 20S (see FIG. 7B) to pattern processing.

Specifically, a resist pattern (not shown) is provided on the polysilicon film 20S by photolithography technology so as to correspond to a pattern of the gate electrodes 22G, 23G, 24G, and 25G of the respective transistors 22, 23, 24, and 25. Then, the polysilicon film 20S is etched with the resist pattern (not shown) as a mask. The gate electrodes 22G, 23G, 24G, and 25G of the respective transistors 22, 23, 24, and 25 are thereby formed from the polysilicon film 20S.

Then, a p-type semiconductor region 101$pc$ is provided in a shallow part on the top surface side in the n-type charge accumulating region 101$nb$. For example, the p-type semiconductor region 101$pc$ is formed by ion-implanting a p-type impurity so as to be in an impurity concentration range as shown in the following.

P-Type Semiconductor Region 101$pc$
Impurity Concentration: $1 \times 10^{17}$ to $1 \times 10^{18}$ cm$^{-3}$ (preferably $5 \times 10^{17}$ to $5 \times 10^{18}$ cm$^{-3}$)

Then, the sources and drains of the respective transistors 22, 23, 24, and 25 (including a floating diffusion FD) are formed. For example, the sources and drains of the respective transistors 22, 23, 24, and 25 are formed so as to be in impurity concentration ranges as shown in the following.

Sources and Drains of Respective Transistors 22, 23, 24, and 25

Impurity Concentration: $1 \times 10^{19}$ cm$^{-3}$ or higher

Incidentally, though not shown, sidewalls (not shown) are formed on side parts of the respective gate electrodes 22G, 23G, 24G, and 25G.

(d) Formation of Metallic Layer 301

Figure 7D:
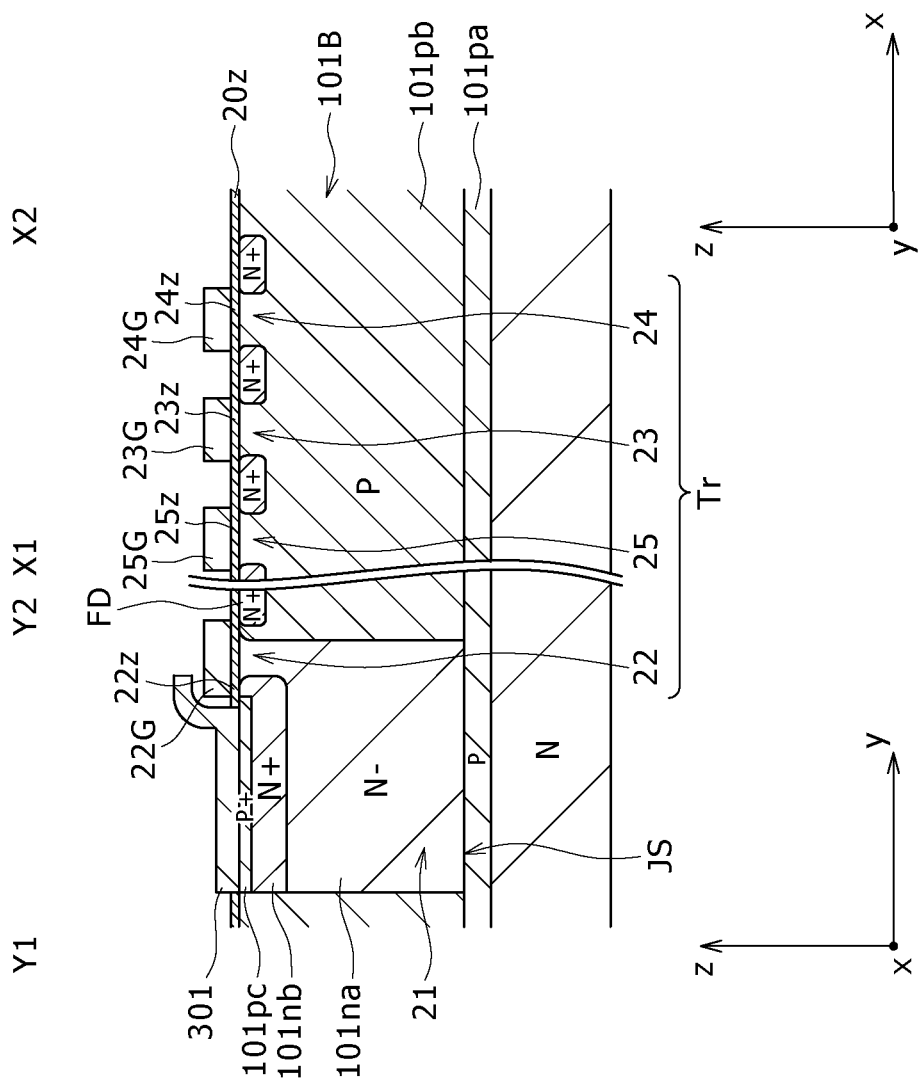

Next, as shown in FIG. 7D, a metallic layer 301 is formed.

In this case, as shown in FIG. 7D, the metallic layer 301 is formed so as to cover the surface of the p-type semiconductor region 101pc in the semiconductor substrate 101B. In addition, the metallic layer 301 is formed so as to cover a part of the gate electrode 22G of the transfer transistor 22 with an insulating film (not shown) interposed between the metallic layer 301 and the part of the gate electrode 22G of the transfer transistor 22.

Specifically, the insulating film 20z covering a part on which to form the metallic layer 301 in the surface of the p-type semiconductor region 101pc of the semiconductor substrate 101B is removed, and the surface of that part is exposed. Then, a platinum (Pt) film (not shown) is formed. For example, a platinum (Pt) film having a thickness of 1 nm to 50 nm is formed by a sputtering method. Then, the platinum (Pt) film (not shown) is subjected to pattern processing, whereby the metallic layer 301 is formed.

(e) Formation of Metallic Silicide Layer 301S

Next, as shown in FIG. 7E, a metallic silicide layer 301S is formed.

In this case, as shown in FIG. 7E, the metallic silicide layer 301S is formed by alloying a part of the metallic layer 301 which part faces the p-type semiconductor region 101pc in the semiconductor substrate 101B.

For example, an annealing process is performed according to the following conditions under a nitrogen atmosphere. Thereby, platinum (Pt) in the metallic layer 301 and silicon (Si) in the p-type semiconductor region 101pc are formed into a silicide, and a platinum silicide layer is formed, whereby the metallic silicide layer 301S is provided.

Annealing Process Conditions

Temperature: 500° C.

Process Time: 30 seconds (f) Removal of Metallic Layer 301

Figure 7F:
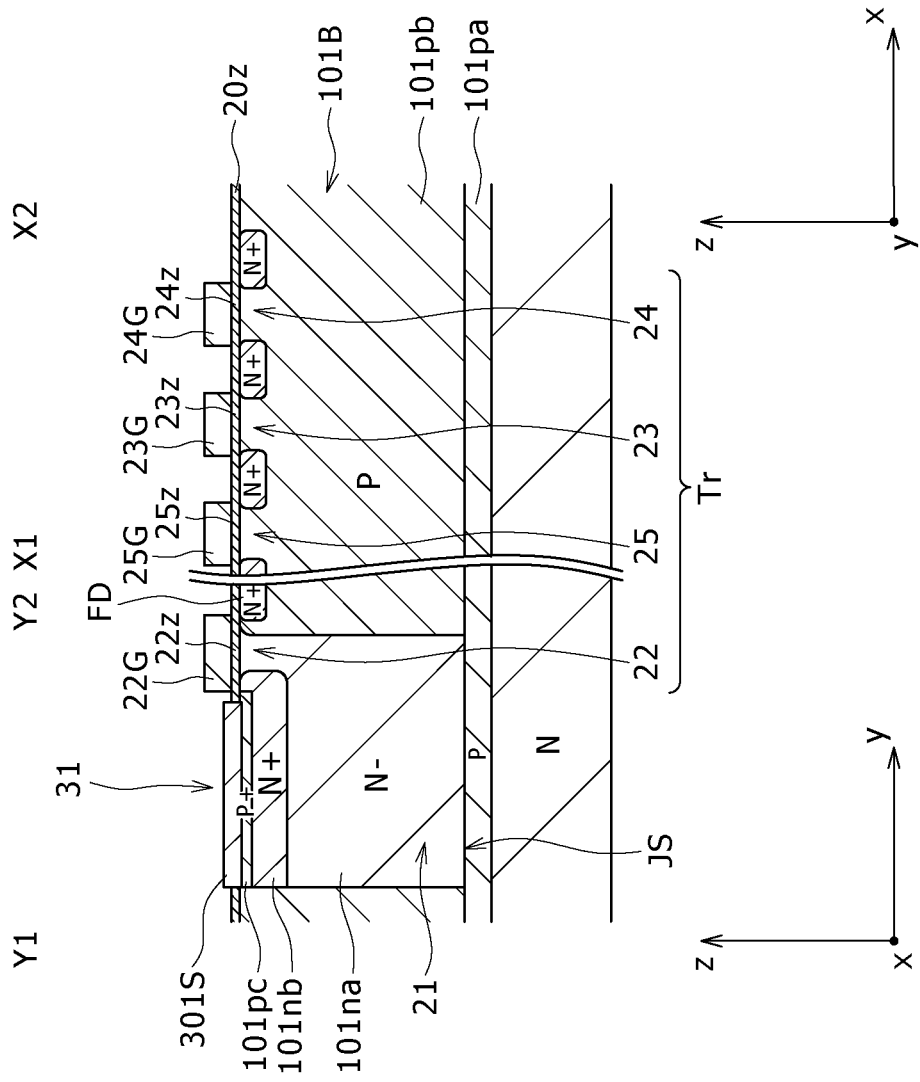

Next, as shown in FIG. 7F, the metallic layer 301 is removed.

In this case, as shown in FIG. 7F, a part other than a part in which the metallic silicide layer 301S is formed in the metallic layer 301 (see FIG. 7E) is removed, and the surface of the metallic silicide layer 301S is exposed.

The metallic layer 301 is removed by using aqua regia, for example.

(g) Formation of Other Members such as Wiring Layer 111 and the Like

Next, as shown in FIG. 3, other members such as a wiring layer 111 and the like are formed.

In this case, the wiring layer 111 is provided to the surface of the semiconductor substrate 101B above which surface the gate electrodes 22G, 23G, 24G, and 25G of the respective transistors 22, 23, 24, and 25 are provided. For example, the wiring layer 111 is provided by forming an insulating layer 111z of an insulating material such as a silicon oxide film or the like and forming wiring 111h of a metallic material such as aluminum or the like.

Then, after the wiring layer 111 is provided, a supporting substrate (not shown) is laminated to the upper surface of the wiring layer 111. Then, after the semiconductor substrate 101B is inverted, the semiconductor substrate 101B is subjected to a thinning process. For example, a CMP (Chemical Mechanical Polishing) process is performed as the thinning process. A part of the semiconductor substrate 101B is thereby removed from the bottom surface side.

Specifically, the semiconductor substrate 101B is thinned until the p-type semiconductor region 101pa is exposed. For example, the semiconductor substrate 101B is thinned by performing a CMP process so that the semiconductor substrate 101B has a film thickness of 5 to 15 µm, and a semiconductor layer 101 is formed of the semiconductor substrate 101B, as shown in FIG. 3.

Then, as shown in FIG. 3, a color filter CF and an on-chip lens ML are provided on the bottom surface side of the semiconductor layer 101 in the effective pixel region IMG of the pixel region PA.

On the other hand, in contrast to the pixels P in the effective pixel region IMG, the color filter CF and the on-chip lens ML are not provided in the optical black region OPB of the pixel region PA. A light shielding film (not shown) for shielding the light receiving surface JS from the incident light H is provided in the optical black region OPB. For example, the light shielding film (not shown) is formed by a metallic material such as aluminum or the like.

Thus, a backside illumination type CMOS image sensor is completed.

(4) Summary

As described above, in the present embodiment, the photodiode 21 receiving incident light H and generating a signal charge is provided in the semiconductor layer 101. This photodiode 21 is formed so as to receive the light of a visible ray component of the incident light H and generate a signal charge. In addition, the pixel transistor Tr for outputting the signal charge generated in the photodiode 21 as an electric signal is provided on the side of the top surface on the opposite side from the bottom surface on which the incident light H is made incident in the semiconductor layer 101. The wiring layer 111 including the wiring 111h connected to the pixel transistor Tr is provided so as to cover the pixel transistor Tr on the top surface of the semiconductor layer 101 (see FIG. 3).

Together with this, the infrared absorbing section 31 is provided on the top surface side of the semiconductor layer 101 so as to absorb transmitted light transmitted by the photodiode 21 which transmitted light has a longer wavelength than light absorbed by the photodiode 21, the transmitted light transmitted by the photodiode 21 and the light absorbed by the photodiode 21 being included in the incident light H. In this case, the infrared absorbing section 31 is formed so as to absorb infrared light of the transmitted light transmitted by the photodiode 21. This infrared absorbing section 31 is provided so as to be interposed between the part in which the photodiode 21 is provided in the semiconductor layer 101 and the wiring layer 111. The infrared absorbing section 31 includes a Schottky junction, and absorbs infrared light by the Schottky junction. The Schottky junction of the infrared absorbing section 31 is formed by joining the metallic silicide layer 301S with the p-type semiconductor region 101pc in the semiconductor layer 101 (see FIG. 3).

Thus, in the present embodiment, the infrared absorbing section 31 absorbs infrared light going toward the wiring layer 111 through the semiconductor layer 101 before the infrared light is made incident on the wiring layer 111. That is, the infrared absorbing section 31 blocks the infrared light. Thus, the present embodiment can prevent the infrared light from being reflected by the wiring 111h in the wiring layer 111, thereby preventing the occurrence of color mixture, and therefore improve the color reproducibility of a picked-up image.

Together with this, the present embodiment can prevent the mixing of reflected light reflected by the wiring 111h in the wiring layer 111 in optical black (OB) pixels, and thus prevent variation in the value of a black level signal detected in the OB pixels. Thus, noise components can be removed properly.

In addition, in the present embodiment, the infrared absorbing section 31 absorbs infrared light by the Schottky junction between the metallic silicide layer 301S and the p-type semiconductor region 101pc in the semiconductor layer 101.

Thus, because the Schottky junction is formed by providing the metallic silicide layer 301S directly on the semiconductor layer 101, the present embodiment can provide an effect of absorbing infrared rays without substantial changes in processes or an increase in the number of processes.

Thus, the present embodiment makes it possible to easily improve the image quality of a picked-up image in the "backside illumination type" solid-state imaging device.

<2. Second Embodiment>

(1) Device Configuration and the Like

Figure 8:
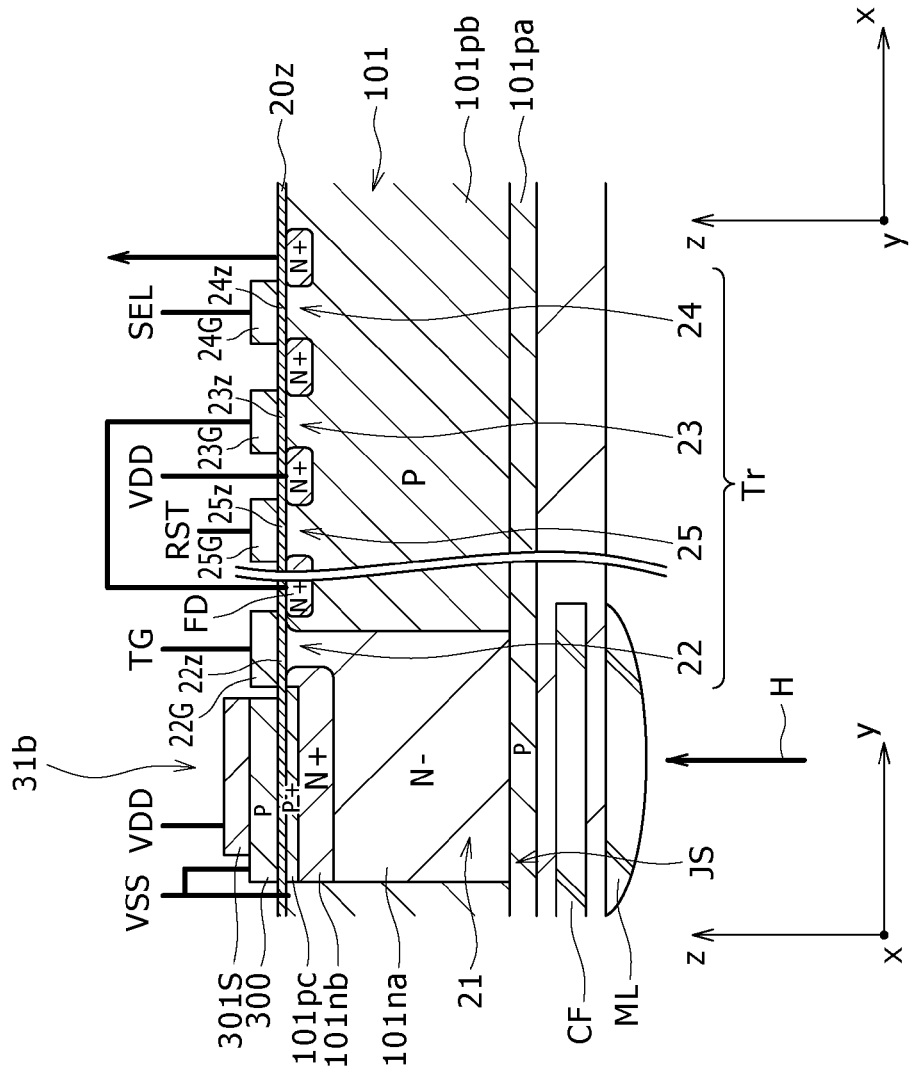
FIG. 8 is a diagram showing principal parts of a solid-state imaging device in a second embodiment of the present disclosure.

FIG. 8 is a diagram showing principal parts of a solid-state imaging device in a second embodiment of the present disclosure.

As with FIG. 4, FIG. 8 shows the electric connection relation of each part together with the section of a pixel P provided as an effective pixel. As in FIG. 4, the wiring layer 111 shown in FIG. 3 is not shown in FIG. 8.

As shown in FIG. 8, an infrared absorbing section 31b in the present embodiment is different from that of the first embodiment. Except for this respect and respects related thereto, the present embodiment is similar to the first embodiment. Thus, repeated description of same parts will be omitted.

As in the first embodiment, the infrared absorbing section 31b is configured to absorb infrared light passed through a photodiode 21, the infrared light being included in incident light H made incident as a subject image.

However, in the present embodiment, unlike the first embodiment, the infrared absorbing section 31b is provided to the surface of a p-type semiconductor region 101pc in a semiconductor layer 101 with an insulating film 20z interposed between the infrared absorbing section 31b and the p-type semiconductor region 101pc, as shown in FIG. 8. That is, the infrared absorbing section 31b is separated from the semiconductor layer 101, and the insulating film 20z is provided so as to be interposed between the infrared absorbing section 31b and the semiconductor layer 101.

The infrared absorbing section 31b includes a polysilicon layer 300 and a metallic silicide layer 301S. The polysilicon layer 300 and the metallic silicide layer 301S are provided so as to be sequentially laminated on the insulating film 20z.

As shown in FIG. 8, the polysilicon layer 300 in the infrared absorbing section 31b is formed so as to cover the p-type semiconductor region 101pc in the semiconductor layer 101 with the insulating film 20z interposed between the polysilicon layer 300 and the p-type semiconductor region 101pc. The polysilicon layer 300 is formed so as to include a p-type impurity.

As shown in FIG. 8, the metallic silicide layer 301S in the infrared absorbing section 31b is formed so as to cover the p-type semiconductor region 101pc in the semiconductor layer 101 with the insulating film 20z and the polysilicon layer 300 interposed between the metallic silicide layer 301S and the p-type semiconductor region 101pc.

The metallic silicide layer 301S is provided so as to form a Schottky junction with the polysilicon layer 300. That is, the infrared absorbing section 31b is formed so as to constitute a Schottky diode, with a Schottky barrier formed in a junction part between the polysilicon layer 300 and the metallic silicide layer 301S. The infrared absorbing section 31b is formed so as to have a band gap absorbing infrared rays. For example, the infrared absorbing section 31b is formed so as to have a band gap of 0.6 eV or less. For example, the metallic silicide layer 301S is formed of Pt (platinum) silicide, as in the first embodiment.

In the infrared absorbing section 31b, a reverse bias voltage is applied to the Schottky diode, as in the first embodiment. Specifically, as shown in FIG. 8, the polysilicon layer 300 is electrically connected to a power supply line (not shown), so that a substrate potential VSS is applied to the polysilicon layer 300. In addition, as shown in FIG. 8, the metallic silicide layer 301S is electrically connected to a power supply line (not shown), so that a power supply potential VDD different from the substrate potential VSS applied to the polysilicon layer 300 is applied to the metallic silicide layer 301S.

The infrared absorbing section 31b is provided in both of an effective pixel region IMG and an optical black region OPB (see FIG. 2) in a similar manner.

(2) Manufacturing Method

Principal parts of a manufacturing method for manufacturing the solid-state imaging device described above will be described.

Figure 9B:
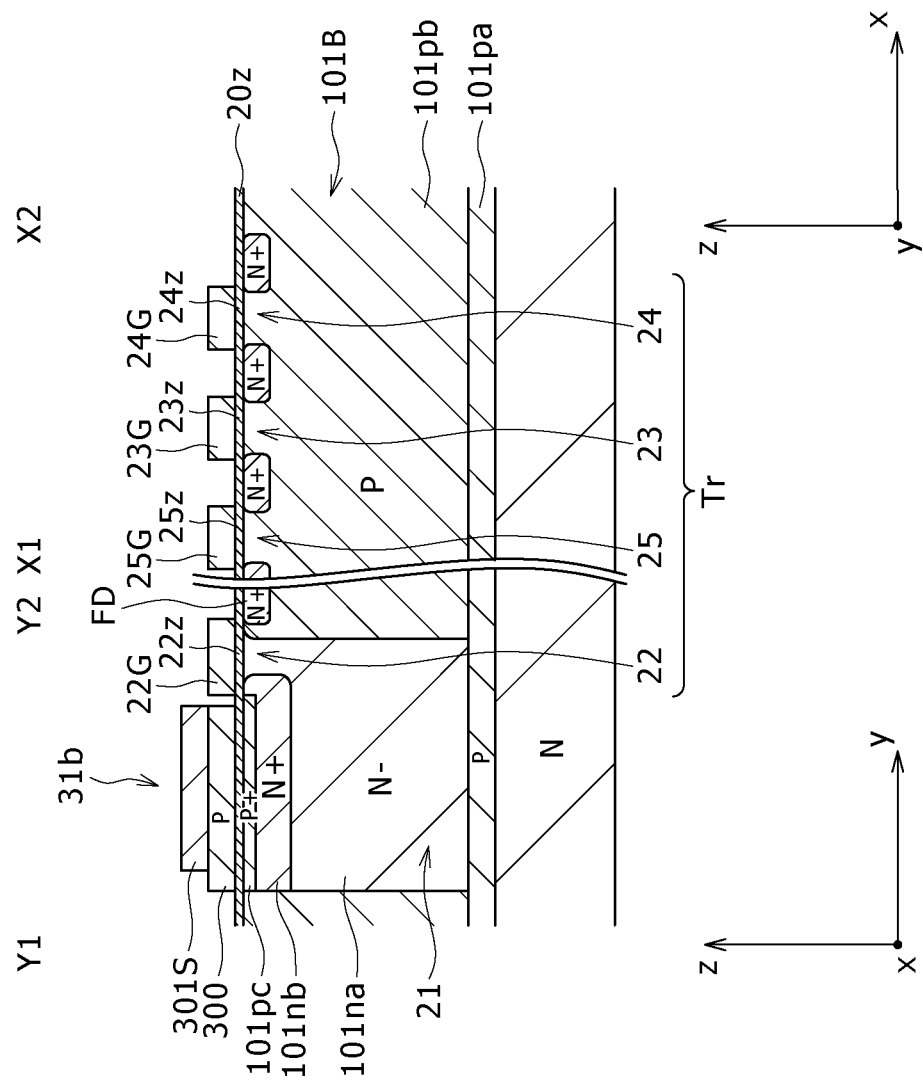

FIGS. 9A and 9B are diagrams of the method of manufacturing the solid-state imaging device in the second embodiment of the present disclosure.

As with FIG. 8, FIGS. 9A and 9B show a section. The solid-state imaging device is manufactured by sequentially undergoing each step shown in FIGS. 9A and 9B.

(a) Formation of Polysilicon Layer 300 and Pixel Transistor Tr

First, as shown in FIG. 9A, a polysilicon layer 300 and a pixel transistor Tr are formed.

Before this process is performed, the formation of an insulating film 20z and a polysilicon film 20S (see FIG. 7B) is performed in advance together with the formation of p-type semiconductor regions 101pa and 101pb and the like (see FIG. 7A).

Thereafter, the gate electrodes 22G, 23G, 24G, and 25G of respective transistors 22, 23, 24, and 25 are formed by subjecting the polysilicon film 20S (see FIG. 7B) to pattern processing. Together with this, the polysilicon layer 300 forming the infrared absorbing section 31b (see FIG. 8) is also formed by subjecting the polysilicon film 20S (see FIG. 7B) to pattern processing.

Specifically, a resist pattern (not shown) is provided on the polysilicon film 20S by photolithography technology so as to correspond to a pattern of the gate electrodes 22G, 23G, 24G, and 25G and the polysilicon layer 300. Then, the polysilicon film 20S is etched with the resist pattern (not shown) used as a mask. The polysilicon layer 300 and the gate electrodes 22G, 23G, 24G, and 25G of the respective transistors 22, 23, 24, and 25 are thereby formed from the polysilicon film 20S.

Then, as in the first embodiment, the sources and drains of the respective transistors 22, 23, 24, and 25 (including a floating diffusion FD) are formed.

(b) Formation of Metallic Silicide Layer 301S

Next, as shown in FIG. 9B, a metallic silicide layer 301S is formed.

In this case, a platinum (Pt) film (not shown) is formed on the upper surface of the polysilicon layer 300. For example, a platinum (Pt) film having a thickness of 1 nm to 50 nm is formed by a sputtering method. Then, a part of the platinum (Pt) film which part faces the polysilicon layer 300 is alloyed, whereby the metallic silicide layer 301S is formed.

For example, an annealing process is performed according to similar conditions to those of the first embodiment. Thereby, a silicide is formed between the platinum (Pt) layer (not shown) and the polysilicon layer 300, and a platinum silicide layer is formed, whereby the metallic silicide layer 301S is provided.

Then, as in the first embodiment, a part other than a part in which the metallic silicide layer 301S is formed in the platinum (Pt) layer (not shown) is removed, and the surface of the metallic silicide layer 301S is exposed.

Thereafter, as in the first embodiment, other members such as a wiring layer 111 and the like are formed.

Thus, a backside illumination type CMOS image sensor is completed.

(3) Summary

As described above, in the present embodiment, as in the first embodiment, the infrared absorbing section 31b is provided so as to absorb infrared light of transmitted light transmitted by the photodiode 21. The infrared absorbing section 31b in this case includes the polysilicon layer 300 provided to the top surface of the semiconductor layer 101 with the insulating film 20z interposed between the polysilicon layer 300 and the top surface of the semiconductor layer 101. The Schottky junction of the infrared absorbing section 31b is formed by joining the polysilicon layer 300 and the metallic silicide layer 301S with each other.

As in the first embodiment, the infrared absorbing section 31b absorbs infrared light going toward the wiring layer 111 through the semiconductor layer 101 before the infrared light is made incident on the wiring layer 111. Thus, the present embodiment can prevent the infrared light from being reflected by the wiring 111h in the wiring layer 111, thereby preventing the occurrence of color mixture, and therefore improve the color reproducibility of a picked-up image.

Together with this, as in the first embodiment, the present embodiment can prevent the mixing of reflected light reflected by the wiring 111h in the wiring layer 111 in optical black (OB) pixels, and thus prevent variation in the value of a black level signal detected in the OB pixels. Thus, the present embodiment can remove noise components properly.

In addition, in the present embodiment, the infrared absorbing section 31b is provided to the top surface of the semiconductor layer 101 with the insulating film 20z interposed between the infrared absorbing section 31b and the top surface of the semiconductor layer 101.

Thus, because the Schottky junction of the infrared absorbing section 31b is not directly provided on the semiconductor layer 101, the present embodiment can provide an effect of absorbing infrared rays without affecting photodiode characteristics.

Thus, the present embodiment makes it possible to easily improve the image quality of a picked-up image in the "backside illumination type" solid-state imaging device.

<3. Third Embodiment>

(1) Device Configuration and the Like

Figure 10:
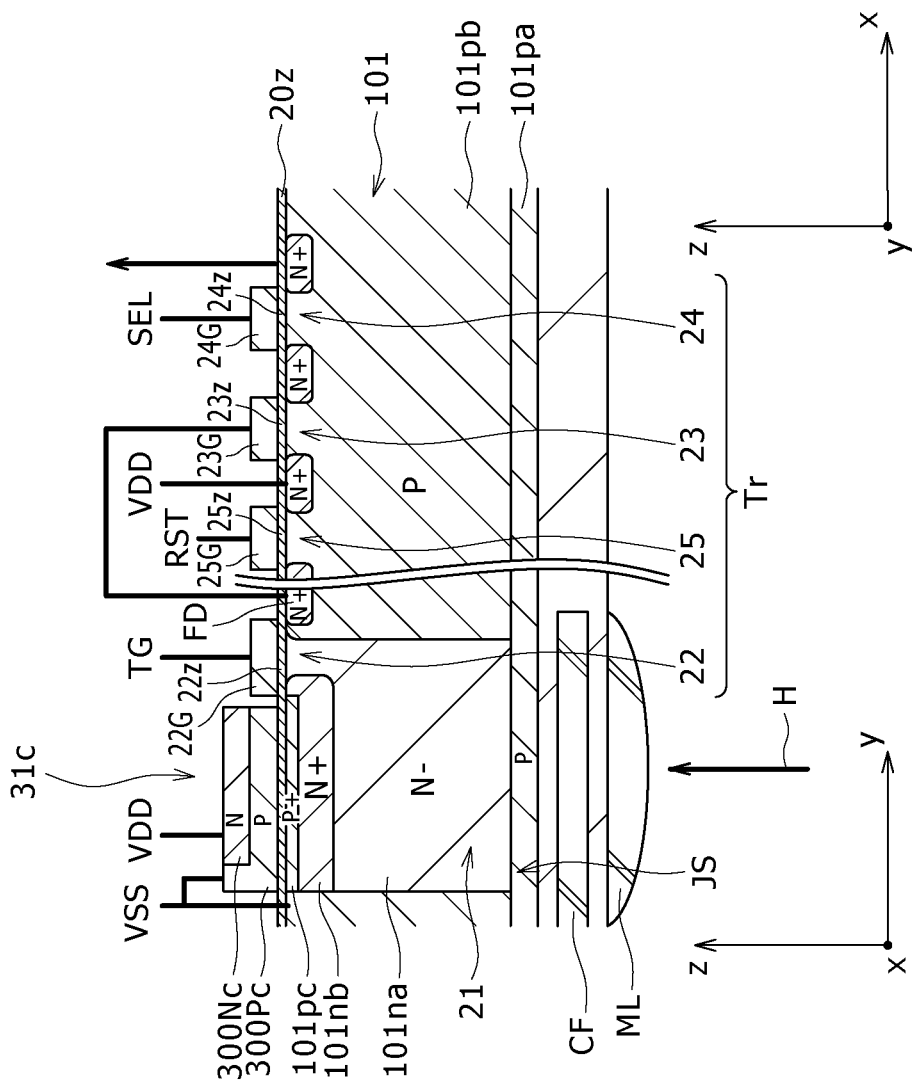
FIG. 10 is a diagram showing principal parts of a solid-state imaging device in a third embodiment of the present disclosure.

FIG. 10 is a diagram showing principal parts of a solid-state imaging device in a third embodiment of the present disclosure.

As with FIG. 8, FIG. 10 shows the electric connection relation of each part together with the section of a pixel P provided as an effective pixel. As in FIG. 8, the wiring layer 111 shown in FIG. 3 is not shown in FIG. 10.

As shown in FIG. 10, an infrared absorbing section 31c in the present embodiment is different from that of the second embodiment. Except for this respect and respects related thereto, the present embodiment is similar to the second embodiment. Thus, repeated description of same parts will be omitted.

As in the second embodiment, the infrared absorbing section 31c is configured to absorb infrared light passed through a photodiode 21, the infrared light being included in incident light H made incident as a subject image.

In addition, as in the second embodiment, the infrared absorbing section 31c is provided to the surface of a p-type semiconductor region 101pc in a semiconductor layer 101 with an insulating film 20z interposed between the infrared absorbing section 31c and the p-type semiconductor region 101pc, as shown in FIG. 10.

However, unlike the second embodiment, the infrared absorbing section 31c includes a P-type section 300Pc and an N-type section 300Nc, and the infrared absorbing section 31c is provided on the insulating film 20z such that the P-type section 300Pc and the N-type section 300Nc are sequentially stacked.

The P-type section 300Pc in the infrared absorbing section 31c is formed by a semiconductor doped with a p-type impurity. As shown in FIG. 10, the P-type section 300Pc is formed so as to cover the p-type semiconductor region 101pc in the semiconductor layer 101 with the insulating film 20z interposed between the P-type section 300Pc and the p-type semiconductor region 101pc.

The N-type section 300Nc in the infrared absorbing section 31c is formed by a semiconductor doped with an n-type impurity. As shown in FIG. 10, the N-type section 300Nc is formed so as to cover the p-type semiconductor region 101pc in the semiconductor layer 101 with the insulating film 20z and the P-type section 300Pc interposed between the N-type section 300Nc and the p-type semiconductor region 101pc.

The N-type section 300Nc is provided so as to form a pn junction with the P-type section 300Pc. That is, the infrared absorbing section 31c is formed so as to constitute a pn junction diode, with a barrier formed in a junction part between the N-type section 300Nc and the P-type section 300Pc. The infrared absorbing section 31c is formed so as to have a band gap absorbing infrared rays. For example, the infrared absorbing section 31c is formed so as to have a band gap of 0.6 eV or less.

For example, the P-type section 300Pc is formed by a p-type InGaAs compound semiconductor doped with zinc (Zn), and the N-type section 300Nc is formed by an n-type InGaAs compound semiconductor doped with silicon (Si).

In addition to InGaAs, the P-type section 300Pc and the N-type section 300Nc may be formed by a IV or III-V compound semiconductor such as Ge, SiGe, GaAs, InAs, InSb or the like. In addition, the P-type section 300Pc and the N-type section 300Nc may be formed by a chalcopyrite type semiconductor having a narrow band gap.

In the infrared absorbing section 31c, a reverse bias voltage is applied to the pn junction diode, as in the second embodiment. Specifically, as shown in FIG. 10, the P-type section 300Pc is electrically connected to a power supply line (not shown), so that a substrate potential VSS is applied to the P-type section 300Pc. In addition, as shown in FIG. 10, the N-type section 300Nc is electrically connected to a power supply line (not shown), so that a power supply potential VDD different from the substrate potential VSS applied to the P-type section 300Pc is applied to the N-type section 300Nc.

The infrared absorbing section 31c is provided in both of an effective pixel region IMG and an optical black region OPB (see FIG. 2) in a similar manner.

(2) Manufacturing Method

Principal parts of a manufacturing method for manufacturing the solid-state imaging device described above will be described.

FIGS. 11A and 11B are diagrams of the method of manufacturing the solid-state imaging device in the third embodiment of the present disclosure.

As with FIG. 10, FIGS. 11A and 11B show a section. The solid-state imaging device is manufactured by sequentially undergoing each step shown in FIGS. 11A and 11B.

(a) Formation of P-Type Section 300Pc

First, as shown in FIG. 11A, a P-type section 300Pc is formed.

Before this process is performed, the formation of an insulating film 20z and a polysilicon film 20S (see FIG. 7B) is performed in advance together with the formation of p-type semiconductor regions 101pa and 101pb and the like (see FIG. 7A). Further, a pixel transistor Tr is formed (see FIG. 7C).

Thereafter, as shown in FIG. 11A, a P-type section 300Pc is formed.

In this case, as shown in FIG. 11A, the P-type section 300Pc is formed so as to cover the surface of a p-type semiconductor region 101pc in a semiconductor substrate 101B.

Specifically, a p-type InGaAs compound semiconductor film doped with zinc (Zn) is formed as the P-type section 300Pc.

(b) Formation of N-Type Section 300Nc

Next, as shown in FIG. 11B, an N-type section 300Nc is formed.

In this case, silicon (Si) is ion-implanted and diffused into a part in which to form the N-type section 300Nc in the P-type section 300Pc. The N-type section 300Nc is thereby formed.

Thereafter, as in the second embodiment, other members such as a wiring layer 111 and the like are formed.

Thus, a backside illumination type CMOS image sensor is completed.

(3) Summary

As described above, in the present embodiment, as in the other embodiments, the infrared absorbing section 31c is provided so as to absorb infrared light of transmitted light transmitted by the photodiode 21. The infrared absorbing section 31c in this case includes the PN junction, and absorbs the infrared light by the PN junction. Specifically, the infrared absorbing section 31c includes the P-type section 300Pc and the N-type section 300Nc of an opposite conductivity type to that of the P-type section 300Pc. The P-type section 300Pc is provided to the top surface of the semiconductor layer 101 with the insulating film 20z interposed between the P-type section 300Pc and the top surface of the semiconductor layer 101. The N-type section 300Nc is provided to the top surface of the semiconductor layer 101 with the insulating film 20z and the P-type section 300Pc interposed between the N-type section 300Nc and the top surface of the semiconductor layer 101. The PN junction of the infrared absorbing section 31c is formed by joining the P-type section 300Pc and the N-type section 300Nc with each other.

As in the other embodiments, the infrared absorbing section 31c absorbs infrared light going toward the wiring layer 111 through the semiconductor layer 101 before the infrared light is made incident on the wiring layer 111. Thus, the present embodiment can prevent the infrared light from being reflected by the wiring 111h in the wiring layer 111, thereby preventing the occurrence of color mixture, and therefore improve the color reproducibility of a picked-up image.

Together with this, as in the other embodiments, the present embodiment can prevent the mixing of reflected light reflected by the wiring 111h in the wiring layer 111 in optical black (OB) pixels, and thus prevent variation in the value of a black level signal detected in the OB pixels. Thus, the present embodiment can remove noise components properly.

In addition, in the present embodiment, the infrared absorbing section 31c absorbs infrared light by the PN junction. Thus, the present embodiment can provide a greater effect of absorbing infrared rays by using a semiconductor material having a higher absorption coefficient for infrared light than silicon.

Thus, the present embodiment makes it possible to easily improve the image quality of a picked-up image in the "backside illumination type" solid-state imaging device.

Incidentally, the PN junction of the infrared absorbing section 31c may be either of a homojunction and a heterojunction.

<4. Fourth Embodiment>

(1) Device Configuration and the Like

FIG. 12 is a diagram showing principal parts of a solid-state imaging device in a fourth embodiment of the present disclosure.

As with FIG. 10, FIG. 12 shows the electric connection relation of each part together with the section of a pixel P provided as an effective pixel. As in FIG. 10, the wiring layer 111 shown in FIG. 3 is not shown in FIG. 12.

As shown in FIG. 12, a transfer transistor 22d is further provided in the present embodiment. Except for this respect and respects related thereto, the present embodiment is similar to the second embodiment. Thus, repeated description of same parts will be omitted.

As shown in FIG. 12, the transfer transistor 22d is configured to output a signal charge generated in a pn junction diode forming an infrared absorbing section 31c to the gate of an amplifying transistor 23 as an electric signal.

Specifically, the transfer transistor 22d has a gate electrically connected to a transfer line (not shown) supplied with a transfer signal TG2. The transfer transistor 22d has a source electrically connected to an N-type section 300Nc of the infrared absorbing section 31c, and has a drain electrically connected to a floating diffusion FD and the gate of the amplifying transistor 23. The gate of the transfer transistor 22d is supplied with the transfer signal TG2 from the transfer line (not shown), whereby the transfer transistor 22d transfers the signal charge accumulated in the pn junction diode forming the infrared absorbing section 31c to the floating diffusion FD. Then, the floating diffusion FD converts the charge into a voltage, and inputs the voltage as an electric signal to the gate of the amplifying transistor 23.

Though not shown, the transfer transistor 22d is provided on the top surface side of a semiconductor layer 101 as with other transistors 22, 23, 24, and 25 as shown in FIG. 3. That is, the gate of the transfer transistor 22d is provided to the top surface of the semiconductor layer 101 with a gate insulating film interposed between the gate of the transfer transistor 22d and the top surface of the semiconductor layer 101.

FIGS. 13A, 13B, 13C, and 13D are diagrams showing the operation of the solid-state imaging device in the fourth embodiment of the present disclosure.

FIGS. 13A, 13B, 13C, and 13D are a timing chart showing pulse signals supplied to respective parts when a signal is read out from a pixel P. FIG. 13A shows a selecting signal SEL input to the gate of the selecting transistor 24. FIG. 13B shows a transfer signal TG1 input to the gate of the transfer transistor 22. FIG. 13C shows the transfer signal TG2 input to the gate of the transfer transistor 22d. FIG. 13D shows a reset signal RST input to the gate of the reset transistor 25.

First, as shown in FIGS. 13A to 13D, in a period from a first time point T1 to a time point before a fifth time point T5, a signal having a visible light reset level and a signal having a visible light signal level are each read out as in the case shown in the first embodiment with reference to FIGS. 6A to 6C.

Specifically, as shown in FIGS. 13A to 13D, at the first time point T1, the selecting signal SEL and the reset signal RST at a high level are transmitted to set the selecting transistor 24 and the reset transistor 25 in an on state. The gate potential of the amplifying transistor 23 is thereby reset.

Next, at a second time point T2, the reset signal RST is set to a low level to set the reset transistor 25 in an off state. Thereafter, a voltage corresponding to a reset level is output to a column circuit 14 as an output signal.

Next, at a third time point T3, the transfer signal TG1 at a high level is transmitted to set the transfer transistor 22 in an on state. A signal charge accumulated in a photodiode 21 is thereby transferred to the floating diffusion FD.

Next, at a fourth time point T4, the transfer signal TG1 is set to a low level to set the transfer transistor 22 in an off state. A voltage having a signal level corresponding to the quantity of the transferred signal charge is thereafter output to the column circuit 14 as an output signal.

Thereafter, as shown in FIGS. 13A to 13D, in a period from the fifth time point T5 to a time point before a ninth time point T9, a signal having an infrared light reset level and a signal having an infrared light signal level are each read out.

In this case, first, as shown in FIGS. 13A to 13D, at the fifth time point T5, the selecting signal SEL and the reset signal RST at a high level are transmitted to set the selecting transistor 24 and the reset transistor 25 in an on state. The gate potential of the amplifying transistor 23 is thereby reset again.

Next, at a sixth time point T6, the reset signal RST is set to a low level to set the reset transistor 25 in an off state. A voltage corresponding to a reset level is thereafter output as an output signal to the column circuit 14.

Next, at a seventh time point T7, the transfer signal TG2 at a high level is transmitted to set the transfer transistor 22d in an on state. A signal charge accumulated in the pn junction diode forming the infrared absorbing section 31c is thereby transferred to the floating diffusion FD.

Next, at an eighth time point T8, the transfer signal TG2 is set to a low level to set the transfer transistor 22d in an off state. A voltage having a signal level corresponding to the quantity of the transferred signal charge is thereafter output to the column circuit 14 as an output signal.

Next, at a ninth time point T9, the transfer signals TG1 and TG2 and the reset signal RST are set to a high level to set the transfer transistors 22 and 22d and the reset transistor 25 in an on state.

Thereafter, at a tenth time point T10, the selecting signal SEL, the transfer signals TG1 and TG2, and the reset signal RST are set to a low level to set the selecting transistor 24, the transfer transistors 22 and 22d, and the reset transistor 25 in an off state.

The column circuit 14 further subjects the signal having the infrared light reset level read out first and the signal having the infrared light signal level read out later to difference processing, and stores a signal resulting from the difference processing. A fixed pattern noise caused by for example variation in Vth of each transistor provided to each pixel is thereby cancelled out also in the signal relating to infrared light.

Because the gates of the respective transistors 22, 22d, 24, and 25 are connected in a row unit composed of a plurality of pixels P arranged in the horizontal direction x, the operation of driving the pixel P as described above is performed simultaneously for the plurality of pixels P arranged in the row unit.

Specifically, as in the other embodiments, the pixels P are selected sequentially in horizontal lines (pixel rows) in the vertical direction by the selecting signal supplied by a vertical driving circuit 13. Then, the transistors of each pixel P are controlled by various timing signals output from the timing generator 18. An output signal in each pixel is thereby output to the column circuit 14 in each column of pixels P through the vertical signal line (not shown).

Then, the signal stored in the column circuit 14 is selected by a horizontal driving circuit 15, and sequentially output to an external output circuit 17.

Thereby, as in the other embodiments, a visible light image is generated from the signal relating to visible light. Together with this, unlike the other embodiments, an infrared light image is generated from the signal relating to infrared light.

(2) Summary

As described above, in the present embodiment, as in the third embodiment, the infrared absorbing section 31c is provided so as to absorb infrared light of transmitted light transmitted by the photodiode 21.

Therefore, as in the third embodiment, the infrared absorbing section 31c absorbs infrared light going toward the wiring layer 111 through the semiconductor layer 101 before the infrared light is made incident on the wiring layer 111. Thus, it is possible to prevent the occurrence of color mixture, and therefore improve the color reproducibility of a picked-up image. Together with this, as in the third embodiment, the present embodiment can prevent the mixing of reflected light reflected by the wiring 111h in the wiring layer 111 in optical black (OB) pixels. Thus, noise components can be removed properly.

The present embodiment therefore makes it possible to easily improve the image quality of a picked-up image in the "backside illumination type" solid-state imaging device.

In addition, in the present embodiment, the infrared absorbing section 31c receives infrared light and generates a signal charge. Then, a pixel transistor Tr outputs the signal charge generated in the infrared absorbing section 31c as an electric signal.

Therefore, the present embodiment generates a visible light image from the signal relating to visible light, and is also able to generate an infrared light image from the signal relating to infrared light, unlike the other embodiments. That is, both of the visible light image and the infrared light image can be generated in the same space.

Incidentally, in the present embodiment, imaging is preferably performed with the solid-state imaging device cooled to minus several ten degrees Celsius by using cooling means such as a Peltier element or the like. This can suppress noise, and improve an S/N ratio.

In addition, imaging may be performed with a subject irradiated with infrared rays by using an infrared light source (an infrared LED, a laser, or the like).

<5. Fifth Embodiment>

(1) Device Configuration and the Like

Figure 14:
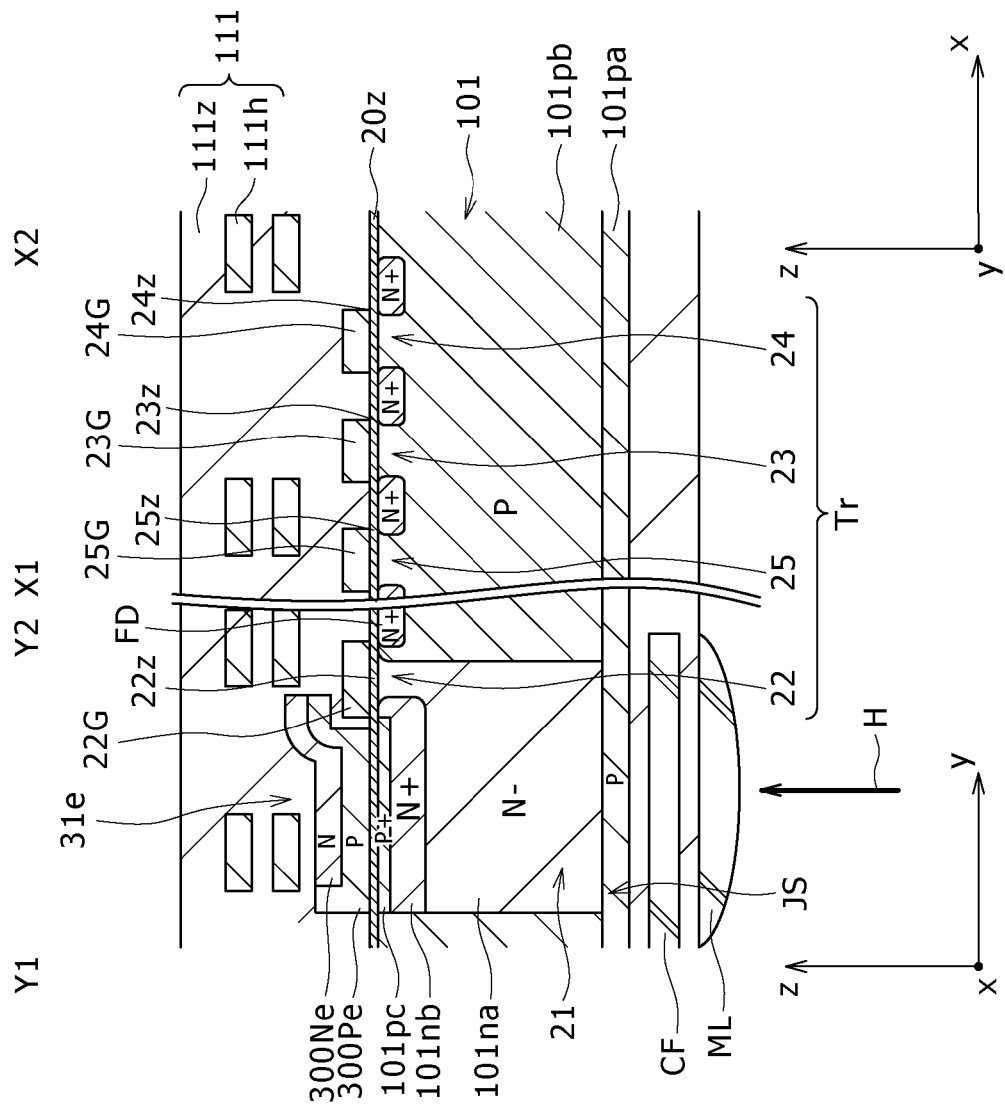
FIG. 14 is a diagram showing principal parts of a solid-state imaging device in a fifth embodiment of the present disclosure.

FIG. 14 is a diagram showing principal parts of a solid-state imaging device in a fifth embodiment of the present disclosure.

As with FIG. 10, FIG. 14 shows the section of a pixel P provided as an effective pixel. Unlike FIG. 10, the wiring layer 111 shown in FIG. 3 is shown in FIG. 14.

As shown in FIG. 14, an infrared absorbing section 31e in the present embodiment is different from that of the third embodiment. Except for this respect and respects related thereto, the present embodiment is similar to the third embodiment. Thus, repeated description of same parts will be omitted.

As in the third embodiment, the infrared absorbing section 31e is configured to absorb infrared light passed through a photodiode 21, the infrared light being included in incident light H made incident as a subject image. In addition, as in the third embodiment, the infrared absorbing section 31e is provided to the surface of a p-type semiconductor region 101pc in a semiconductor layer 101 with an insulating film 20z interposed between the infrared absorbing section 31e and the p-type semiconductor region 101pc, as shown in FIG. 14. In addition, the infrared absorbing section 31e is provided such that a P-type section 300Pe and an N-type section 300Ne are sequentially stacked.

However, unlike the third embodiment, the infrared absorbing section 31e extends over the surface of the semiconductor layer 101 from a part where the photodiode 21 is provided, so as to cover the gate electrode 22G of a transfer transistor 22. In this case, a part extending so as to cover the gate electrode 22G of the transfer transistor 22 in the infrared absorbing section 31e is provided such that an insulating layer 111z forming a wiring layer 111 is interposed between the infrared absorbing section 31e and the gate electrode 22G of the transfer transistor 22.

Specifically, as shown in FIG. 14, the extending part covering the gate electrode 22G of the transfer transistor 22 in the P-type section 300Pe covers the gate electrode 22G of the transfer transistor 22 with the insulating layer 111z interposed between the extending part and the gate electrode 22G of the transfer transistor 22.

In addition, the extending part covering the gate electrode 22G of the transfer transistor 22 in the N-type section 300Ne covers the gate electrode 22G of the transfer transistor 22 with the insulating layer 111z and the P-type section 300Pe interposed between the extending part and the gate electrode 22G of the transfer transistor 22.

The P-type section 300Pe in the infrared absorbing section 31e is formed so as to cover the gate electrode 22G of the transfer transistor 22 as well as the surface of the p-type semiconductor region 101pc in a semiconductor substrate 101B. Thereafter, an n-type impurity is ion-implanted and diffused into a part in which to form the N-type section 300Ne in the P-type section 300Pe. The N-type section 300Ne is thereby formed. As in the third embodiment, the N-type section 300Ne is provided so as to form a pn junction with the P-type section 300Pe.

In the infrared absorbing section 31e, a reverse bias voltage is applied to the pn junction diode, as in the third embodiment.

The infrared absorbing section 31e is provided in both of an effective pixel region IMG and an optical black region OPB (see FIG. 2) in a similar manner.

(2) Summary

As described above, in the present embodiment, as in the third embodiment, the infrared absorbing section 31e is provided so as to absorb infrared light of transmitted light transmitted by the photodiode 21.

Therefore, as in the third embodiment, the infrared absorbing section 31e absorbs infrared light going toward the wiring layer 111 through the semiconductor layer 101 before the infrared light is made incident on the wiring layer 111. Thus, it is possible to prevent the occurrence of color mixture, and therefore improve the color reproducibility of a picked-up image. Together with this, as in the third embodiment, the present embodiment can prevent the mixing of reflected light reflected by the wiring 111h in the wiring layer 111 in optical black (OB) pixels. Thus, noise components can be removed properly.

In particular, in the present embodiment, the infrared absorbing section 31e includes the part extending over the surface of the semiconductor layer 101 from the part where the photodiode 21 is provided, so as to cover the gate electrode 22G of the transfer transistor 22. The present embodiment can thus prevent the incidence of light on the wiring layer 111 from a gap between the infrared absorbing section 31e and the gate electrode 22G of the transfer transistor 22, and hence produce the above-described effect more desirably.

The present embodiment therefore makes it possible to easily improve the image quality of a picked-up image in the "backside illumination type" solid-state imaging device.

<6. Others>

In carrying out the present technology, the present technology is not limited to the foregoing embodiments, but various examples of modification can be adopted.

In the foregoing embodiments, description has been made of a case where an infrared absorbing section for absorbing infrared rays is provided as a light absorbing section. However, the present technology is not limited to a case of absorbing infrared rays. In addition to infrared rays, light having a longer wavelength than the light absorbed by the photodiode 21 easily passes through the photodiode 21. Therefore a light absorbing section may be provided so as to absorb the transmitted light of the longer wavelength.

In the foregoing embodiments, description has been made of a case where four kinds of transistors, that is, a transfer transistor, an amplifying transistor, a selecting transistor, and a reset transistor are provided as a pixel transistor. However, the present technology is not limited to this. For example, the present technology may be applied to a case where three kinds of transistors, that is, a transfer transistor, an amplifying transistor, and a reset transistor are provided as a pixel transistor.

In the foregoing embodiments, description has been made of a case where one transfer transistor, one amplifying transistor, one selecting transistor, and one reset transistor are provided for one photodiode. However, the present technology is not limited to this. For example, the present technology may be applied to a case where one amplifying transistor, one selecting transistor, and one reset transistor are provided for a plurality of photodiodes.

In the foregoing embodiments, description has been made of a case where the present technology is applied to a camera. However, the present technology is not limited to this. The present technology may be applied to other electronic devices including a solid-state imaging device, such as a scanner, a copying machine, and the like.

In addition, in the foregoing embodiments, description has been made of a case where an infrared absorbing section is formed by using an inorganic material such as a metal, a semiconductor, or the like. However, the present technology is not limited to this. An infrared absorbing section may be formed by using an organic compound.

In addition, the configurations of respective embodiments may be combined with each other as appropriate.

Incidentally, in the foregoing embodiments, the solid-state imaging device 1 corresponds to a solid-state imaging device according to an embodiment of the present disclosure. In addition, in the foregoing embodiments, the photodiode 21 corresponds to a photoelectric conversion section according to an embodiment of the present disclosure. In addition, in the foregoing embodiments, the incident light H corresponds to incident light according to an embodiment of the present disclosure. In addition, in the foregoing embodiments, the semiconductor layer 101 corresponds to a semiconductor layer according to an embodiment of the present disclosure. In addition, in the foregoing embodiments, the infrared absorbing sections 31, 31b, 31c, and 31e correspond to a light absorbing section according to an embodiment of the present disclosure. In addition, in the foregoing embodiments, the pixel transistor Tr corresponds to a pixel transistor according to an embodiment of the present disclosure. In addition, in the foregoing embodiments, the wiring 111h corresponds to wiring according to an embodiment of the present disclosure. In addition, in the foregoing embodiments, the wiring layer 111 corresponds to a wiring layer according to an embodiment of the present disclosure. In addition, in the foregoing embodiments, the p-type semiconductor region 101pa corresponds to a first impurity region according to an embodiment of the present disclosure. In addition, in the foregoing embodiments, the n-type charge accumulating regions 101na and 101nb correspond to a second impurity region according to an embodiment of the present disclosure. In addition, in the foregoing embodiments, the p-type semiconductor region 101pc corresponds to a third impurity region according to an embodiment of the present disclosure. In addition, in the foregoing embodiments, the insulating film 20z corresponds to an insulating film according to an embodiment of the present disclosure. In addition, in the foregoing embodiments, the polysilicon layer 300 corresponds to a semiconductor film according to an embodiment of the present disclosure. In addition, in the foregoing embodiments, the P-type sections 300Pc and 300Pe correspond to a first semiconductor section according to an embodiment of the present disclosure. In addition, in the foregoing embodiments, the N-type sections 300Nc and 300Ne correspond to a second semiconductor section according to an embodiment of the present disclosure. In addition, in the foregoing embodiments, the floating diffusion FD corresponds to a floating diffusion according to an embodiment of the present disclosure. In addition, in the foregoing embodiments, the transfer transistor 22 corresponds to a transfer transistor according to an embodiment of the present disclosure. In addition, in the foregoing embodiments, the camera 40 corresponds to an electronic device according to an embodiment of the present disclosure.

The present disclosure contains subject matter related to that disclosed in Japanese Priority Patent Application JP 2010-225088 filed in the Japan Patent Office on Oct. 4, 2010, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. A solid-state imaging device comprising:
a semiconductor layer with oppositely facing first and second surfaces and including therein a photoelectric conversion section operable to receive incident light and generate a signal charge;
a wiring layer on the second surface of the semiconductor layer;
a gate insulating layer on the second surface of the semiconductor layer;
at least one transistor with source/drain regions in the semiconductor layer and the gate insulting layer between a gate of the transistor and the semiconductor layer; and
a light absorbing section on the second surface and interposed between the photoelectric conversion section and the wiring layer, the light absorbing section including a diode directly on a portion of the photoelectric conversion section or with the gate insulating layer between the diode and the photoelectric conversion section, the diode effective to (i) absorb transmitted light transmitted through the photoelectric conversion section and (ii) prevent the transmitted light from passing through the light absorbing section to the wiring layer,
wherein,
the transmitted light (i) is light having a wavelength longer than that of light absorbed by the photoelectric conversion section, and (ii) is included in the incident light, and
the incident light is received by the semiconductor layer via the first surface of the semiconductor layer.

2. The solid-state imaging device according to claim 1, further comprising:
a pixel transistor (i) operable to output the signal charge generated in the photoelectric conversion section as an electric signal, and (ii) disposed on the second surface of the semiconductor layer,
wherein,
the wiring layer (i) covers the pixel transistor on the second surface of the semiconductor layer, and (ii) includes wiring electrically connected to the pixel transistor.

3. The solid-state imaging device according to claim 2, wherein:
the photoelectric conversion section is formed so as to receive light of a visible light component in the incident light, and generate the signal charge, and
the light absorbing section is formed so as to absorb infrared light of the transmitted light transmitted by the photoelectric conversion section.

4. The solid-state imaging device according to claim 3, wherein said light absorbing section diode includes a Schottky junction, and absorbs said infrared light by the Schottky junction.

5. The solid-state imaging device according to claim 4, wherein said Schottky junction of said light absorbing section is formed by joining one of a metallic layer and a metallic silicide layer with said semiconductor layer.

6. The solid-state imaging device according to claim 5, wherein
said photoelectric conversion section includes
a first impurity region of a first conductivity type,
a second impurity region of a second conductivity type different from said first conductivity type, and
a third impurity region of the first conductivity type;
said first impurity region, said second impurity region, and said third impurity region are sequentially formed from a side of said one surface to the side of said other surface in said semiconductor layer; and
said Schottky junction of said light absorbing section is formed by joining one of said metallic layer and said metallic silicide layer with said third impurity region.

7. The solid-state imaging device according to claim 4, wherein:
said light absorbing section includes a semiconductor film disposed such that said portion of gate insulating layer is interposed between the second surface of said semiconductor layer and the semiconductor film, and
said Schottky junction of said light absorbing section is formed by joining one of a metallic layer and a metallic silicide layer with said semiconductor film.

8. The solid-state imaging device according to claim 3, wherein the light absorbing section diode includes—layers forming a PN junction that absorbs the infrared light.

9. The solid-state imaging device according to claim 8, wherein:
the gate insulating layer is interposed between the semiconductor layer and the light absorbing section;

the light absorbing section includes,
  (a) a first semiconductor section of a first conductivity type, the first semiconductor section being disposed such that the gate insulating layer is interposed between the second surface of the semiconductor layer and the first semiconductor section, and
  (b) a second semiconductor section of a second conductivity type opposite to the conductivity type of the first semiconductor section, the second semiconductor section being disposed such that the gate insulating layer and the first semiconductor section are interposed between the second surface of the semiconductor layer and the second semiconductor section; and
the PN junction of the light absorbing section is formed by joining the first semiconductor section to the second semiconductor section.

10. The solid-state imaging device according to claim 9, wherein:
the light absorbing section diode is operable to receive the infrared light and generate a signal charge, and
the pixel transistor is operable to output the signal charge generated in the light absorbing section as an electric signal.

11. The solid-state imaging device according to claim 9, wherein:
the pixel transistor includes a transfer transistor operable to transfer the signal charge generated in the photoelectric conversion section to a floating diffusion, and
the light absorbing section diode includes a part extending so as to cover a gate electrode of the transfer transistor from the part including the photoelectric conversion section at the second surface of the semiconductor layer.

12. The solid-state imaging device according to claim 1, wherein the light absorbing section diode overlies most of the photoelectric conversion section.

13. The solid-state imaging device according to claim 1, wherein,
the light absorbing section diode in combination with the gate insulating film completely cover a side of the photoelectric conversion section between the photoelectric conversion section and the wiring layer.

14. The solid-state imaging device according to claim 1, wherein,
the light absorbing section diode includes a p+ type layer and an n+ type layer forming a PN junction, and
the n+ type layer is nested within the p+ type layer.

15. A solid-state imaging device manufacturing method comprising:
forming a semiconductor layer with oppositely facing first and second surfaces and including a photoelectric conversion section operable to receive incident light and generate a signal charge;
forming transistors and a gate insulating film on the second surface such that the gate insulating layer is on the second surface and between at least one transistor gate and its source/drain regions in the semiconductor layer;
forming a light absorbing section with a diode on the second surface, the diode being either directly on a portion of the photoelectric conversion section or with a portion of the gate insulating layer between the diode and the photoelectric conversion section;
forming a wiring layer on the second surface such that the light absorbing layer is interposed between the photoelectric conversion section and the wiring layer, the light absorbing section diode effective to (i) absorb transmitted light transmitted through the photoelectric conversion section, and (ii) prevent all of the transmitting light from passing through the light absorbing section to the wiring layer,
wherein,
the transmitted light (i) is light having a wavelength longer than that of light absorbed by the photoelectric conversion section, and (ii) is included in the incident light, and
the incident light is received by the semiconductor layer via the first surface of the semiconductor layer.

16. The method according to claim 15, wherein the light absorbing section diode overlies most of a side of the photoelectric conversion section.

17. The method according to claim 15,
wherein,
the light absorbing section diode and the gate insulating layer together completely overlie the photoelectric conversion section.

18. An electronic device comprising:
a semiconductor layer with oppositely facing first and second surfaces and including a photoelectric conversion section operable to receive incident light and generate a signal charge;
a wiring layer on the second surface of the semiconductor layer;
a gate insulating layer on the second surface of the semiconductor layer;
at least one transistor with source/drain regions in the semiconductor layer and the gate insulting layer between a gate of the transistor and the semiconductor layer; and
a light absorbing section on the second surface and interposed between the photoelectric conversion section and the wiring layer, the light absorbing section including a diode directly on a portion of the photoelectric conversion section or with a portion of the gate insulating film between the diode and the photoelectric conversion section and effective to (i) absorb transmitted light transmitted through the photoelectric conversion section, and (ii) prevent the transmitted light from passing through the light absorbing section to the wiring layer,
wherein,
the transmitted light (i) is light having a wavelength longer than that of light absorbed by the photoelectric conversion section, and (ii) is included in the incident light, and
the incident light is received by the semiconductor layer via the first surface of the semiconductor layer.

19. The electronic device according to claim 18, wherein the light absorbing section diode overlies most of the photoelectric conversion section.

20. The electronic device according to claim 18,
wherein,
the light absorbing section diode and the gate insulating layer together completely overlie the photoelectric conversion section.

21. The solid-state imaging device of claim 1, wherein the photoelectric conversion section includes a Hall Accumulated Diode (HAD) structure.

22. The solid-state imaging device of claim 1, wherein the light absorbing diode has a band gap of 0.6 eV or less.

* * * * *